(12) United States Patent
Kitadani et al.

(10) Patent No.: US 9,208,708 B2
(45) Date of Patent: Dec. 8, 2015

(54) ELECTRO-OPTICAL DEVICE AND ELECTRONIC APPARATUS

(71) Applicant: SEIKO EPSON CORPORATION, Tokyo (JP)

(72) Inventors: Kazuma Kitadani, Chino (JP); Takeshi Nomura, Shiojiri (JP); Hitoshi Ota, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 273 days.

(21) Appl. No.: 13/826,834

(22) Filed: Mar. 14, 2013

(65) Prior Publication Data

US 2013/0286054 A1      Oct. 31, 2013

(30) Foreign Application Priority Data

Apr. 25, 2012   (JP) .................. 2012-099990

(51) Int. Cl.
*G09G 3/00* (2006.01)
*G09G 3/32* (2006.01)
*H01L 27/32* (2006.01)

(52) U.S. Cl.
CPC .............. *G09G 3/001* (2013.01); *G09G 3/3225* (2013.01); *H01L 27/3265* (2013.01); *H01L 27/3276* (2013.01); *G09G 2300/0426* (2013.01); *G09G 2300/0838* (2013.01); *G09G 2310/0251* (2013.01); *G09G 2320/0233* (2013.01); *G09G 2320/045* (2013.01)

(58) Field of Classification Search
CPC .............. G09G 2300/0421; G09G 2300/0426; G09G 2300/0429
USPC .................................................... 345/204, 205
See application file for complete search history.

(56) References Cited

U.S. PATENT DOCUMENTS

| | | | |
|---|---|---|---|
| 6,847,340 B2 * | 1/2005 | Wang et al. | 345/76 |
| 2010/0045646 A1 | 2/2010 | Kishi | |
| 2010/0079419 A1 * | 4/2010 | Shibusawa | 345/204 |
| 2011/0050741 A1 | 3/2011 | Jeong | |
| 2012/0229438 A1 * | 9/2012 | Fujita | 345/211 |
| 2013/0120338 A1 | 5/2013 | Kubota et al. | |
| 2013/0120341 A1 | 5/2013 | Kasai et al. | |

FOREIGN PATENT DOCUMENTS

| | | |
|---|---|---|
| JP | A 2005-352411 | 12/2005 |
| JP | A 2011-53635 | 3/2011 |
| WO | WO 2008/108024 A1 | 9/2008 |

* cited by examiner

*Primary Examiner* — Ilana Spar
(74) *Attorney, Agent, or Firm* — Oliff PLC

(57) ABSTRACT

An electro-optical device includes a first pixel circuit provided so as to correspond to a first data line, a second pixel circuit provided so as to correspond to a second data line, a first storage capacitor of which one end is connected to the first data line and the other end is potential-shifted according to a current to be supplied to a light emitting element of the first pixel circuit, a second storage capacitor of which one end is connected to the second data line and the other end is potential-shifted according to a current to be supplied to a light emitting element of the second pixel circuit, and a constant potential line provided between the first storage capacitor and the second storage capacitor in plan view.

13 Claims, 18 Drawing Sheets

<(b) INITIALIZATION SECTION>

<(d) WRITING SECTION>

ELECTRO-OPTICAL DEVICE AND ELECTRONIC APPARATUS

BACKGROUND

1. Technical Field

The present invention relates to a technique for preventing deterioration in display quality when an image is displayed using, for example, an electro-optical element.

2. Related Art

In recent years, a variety of electro-optical devices using a light emitting element such as an organic light emitting diode (hereinafter, referred to as an "OLED") have been proposed. These electro-optical devices generally have a configuration in which pixel circuits are provided so as to correspond to intersections of scanning lines and data lines. The pixel circuit includes the light emitting element, a driving transistor, and the like, and is provided so as to correspond to a pixel of an image to be displayed.

In this configuration, when a data signal with a potential corresponding to a grayscale level of the pixel is applied to a gate of the driving transistor, the driving transistor supplies a current corresponding to a voltage between the gate and the source to the light emitting element. Thereby, the light emitting element emits light at a luminance corresponding to the grayscale level. At this time, if characteristics such as a threshold voltage of the driving transistor vary for each pixel circuit, unevenness of the display which seems to spoil uniformity of a display screen occurs.

For this reason, a technique for compensating the characteristics of the driving transistor in the pixel circuit has been proposed (for example, refer to JP-A-2011-53635).

However, with the progress of miniaturization of the electro-optical device, various wires, terminals, electrodes, and the like become closer to each other, and thus capacitive coupling tends to occur therebetween. For this reason, if a potential varies in a certain electrode, this influences potentials of other electrodes and thus causes display quality to deteriorate.

SUMMARY

An advantage of some aspects of the invention is to provide an electro-optical device and an electronic apparatus, capable of preventing deterioration in display quality even if the electro-optical device is miniaturized.

According to an aspect of the invention, there is provided an electro-optical device including a plurality of data lines; a first pixel circuit provided so as to correspond to a first data line among the plurality of data lines; a second pixel circuit provided so as to correspond to a second data line among the plurality of data lines, each of the first pixel circuit and the second pixel circuit including a light emitting element and a driving transistor that supplies a current corresponding to a gate-source voltage to the light emitting element; a first storage capacitor of which one end is connected to the first data line and the other end is potential-shifted according to a current to be supplied to the light emitting element of the first pixel circuit; a second storage capacitor of which one end is connected to the second data line and the other end is potential-shifted according to a current to be supplied to the light emitting element of the second pixel circuit; and a constant potential line provided between the first storage capacitor and the second storage capacitor in plan view.

According to the aspect of the invention, the constant potential line provided between the first storage capacitor and the second storage capacitor functions as a shield line. Therefore, the first data line and the second data line are difficult to be mutually influenced by potential variations via the first storage capacitor and the second storage capacitor, respectively, and thus it is possible to prevent deterioration in display quality.

In the aspect, one end of the first storage capacitor and one end of the second storage capacitor may be formed of one of a first conductive layer and a second conductive layer, the other end of the first storage capacitor and the other end of the second storage capacitor may be formed of the other of the first conductive layer and the second conductive layer, and the constant potential line may be formed of at least a wire of the first conductive layer and a wire of the second conductive layer.

According to this configuration, the first storage capacitor and the second storage capacitor are formed of the first conductive layer and the second conductive layer. The constant potential line is also formed of the first conductive layer and the second conductive layer. A function as a shield line is improved.

In this configuration, preferably, the wire of the first conductive layer and the wire of the second conductive layer of the constant potential line are electrically connected to each other. According to this configuration, a shield function in a cross-section direction is also improved.

In addition, the wire of the first conductive layer and the wire of the second conductive layer of the constant potential line may be electrically disconnected from each other. In a case of the disconnection, potentials of the wire of the first conductive layer and the wire of the second conductive layer of the constant potential line may be the same potential or different potentials.

In the aspect, a wire for supplying a reset potential may be used as the constant potential line. In other words, the light emitting element may be a two-terminal element, and the light emitting element and the driving transistor may be electrically connected in series between two different power supply potentials. In addition, of the two terminals of the light emitting element, a potential of the terminal on the driving transistor side may become a predetermined reset potential after a current is supplied by the driving transistor, and the reset potential may be supplied to the constant potential line.

Further, in the aspect, a power supply line of the light emitting element may be used as the constant potential line. In other words, the light emitting element and the driving transistor may be electrically connected in series between two different power supply potentials, and one of the two different power supply potentials may be supplied to the constant potential line.

In addition, the invention may be conceptually applied to an electronic apparatus including the electro-optical device as well as the electro-optical device. The electronic apparatus may typically include a display apparatus such as a head mounted display (HMD) or an electronic viewfinder.

BRIEF DESCRIPTION OF THE DRAWINGS

The invention will be described with reference to the accompanying drawings, wherein like numbers reference like elements.

FIG. 18 is a perspective view illustrating a head mounted display (HMD) using the electro-optical device related to the embodiment or the like.

DESCRIPTION OF EXEMPLARY EMBODIMENTS

Hereinafter, an embodiment of the invention will be described with reference to the drawings.

Figure 1:
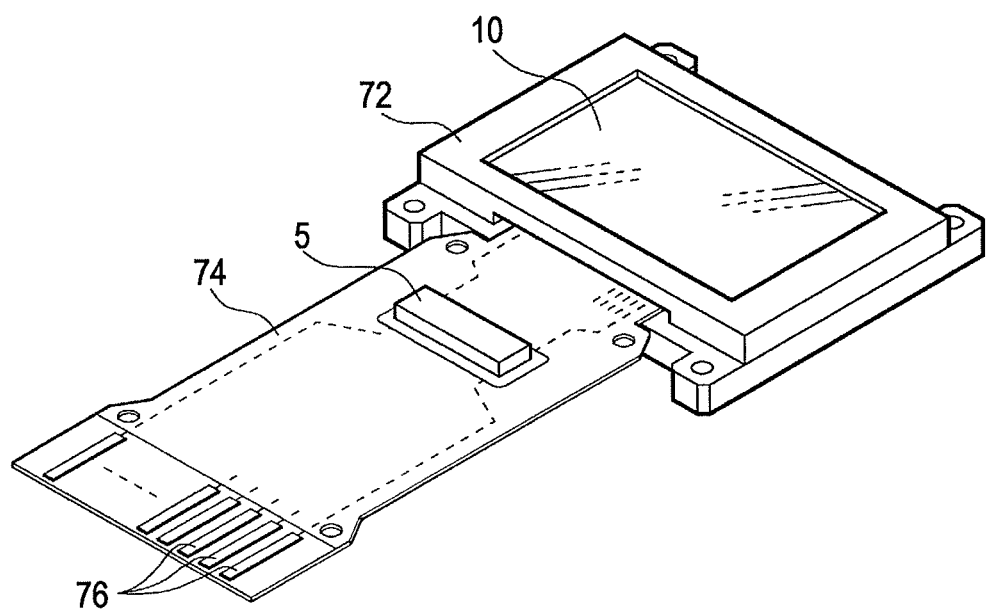
FIG. 1 is a perspective view illustrating a configuration of an electro-optical device according to an embodiment of the invention.

FIG. 1 is a perspective view illustrating a configuration of an electro-optical device 10 according to an embodiment of the invention.

The electro-optical device 10 is a micro-display which displays color images, for example, in a Head Mounted Display (HMD) or the like. Details of the electro-optical device 10 will be described later, and the electro-optical device 10 is an organic EL device in which a plurality of pixel circuits, driving circuits for driving the pixel circuits, and the like are formed on, for example, a semiconductor silicon substrate. An OLED which is an example of the light emitting element is used in the pixel circuit.

The electro-optical device 10 is accommodated in a frame-shaped case 72 which is opened in a display region, and is connected to one end of a Flexible Printed Circuit (FPC) board 74. A plurality of terminals 76 are provided in the other end of the FPC board 74 and are connected to a higher-rank circuit (not shown). A control circuit 5 of a semiconductor chip is mounted on the FPC board in a Chip On Film (COF) type, and image (video) data is supplied thereto from the higher-rank circuit in synchronization with synchronization signals via a plurality of terminals 76. The synchronization signals include a vertical synchronization signal, a horizontal synchronization signal, and a dot clock signal. In addition, image data defines a grayscale level of a pixel of an image to be displayed, for example, with 8 bits for each of RGB.

The control circuit 5 functions as both a power supply circuit and a data signal output circuit of the electro-optical device 10. That is to say, the control circuit 5 supplies various control signals generated according to synchronization signals or various potentials (voltages) to the electro-optical device 10 and converts digital image data into an analog data signal which is supplied to the electro-optical device 10.

Figure 2:
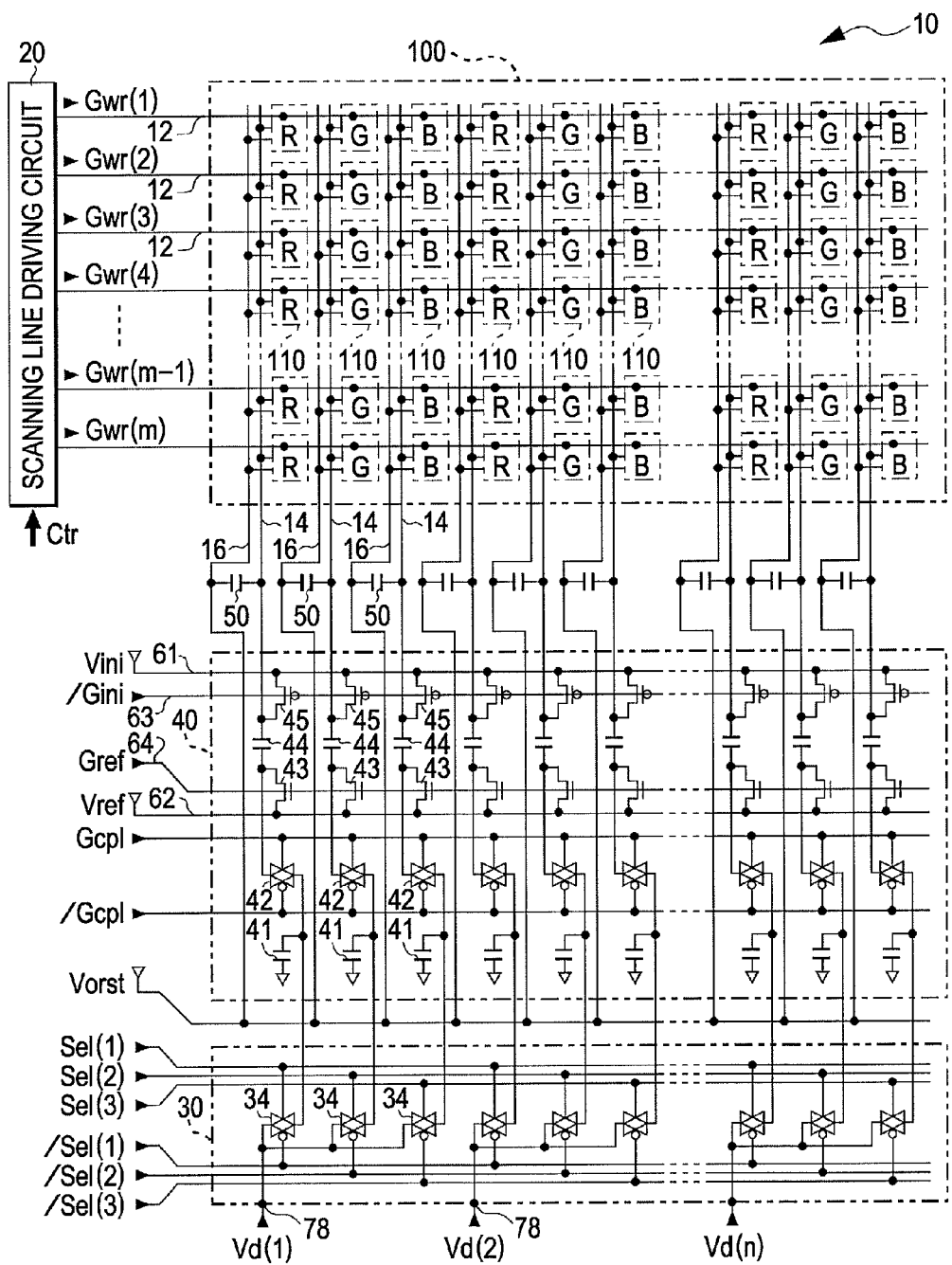
FIG. 2 is a diagram illustrating an electrical configuration of the electro-optical device.

FIG. 2 is a diagram illustrating an electrical configuration of the electro-optical device 10 according to the embodiment. As illustrated in FIG. 2, the electro-optical device 10 largely includes a scanning line driving circuit 20, a demultiplexer 30, a level shift circuit 40, and a display unit 100.

Among them, in the display unit 100, pixel circuits 110 corresponding to pixels of an image to be displayed are arranged in a matrix. Specifically, in the display unit 100, scanning lines 12 of m rows are provided so as to extend in the transverse direction in the figure, and, data lines 14 of 3n columns which are grouped, for example, every three columns, extend in the longitudinal direction in the figure and are provided so as to intersect the respective scanning lines 12 while maintaining electrical insulation therefrom. In addition, the pixel circuits 110 are provided at positions corresponding to intersections of the scanning lines 12 of the m rows and the data line 14 of the 3n columns.

Here, m and n are natural numbers. In order to differentiate rows from each other in the matrix of the scanning lines 12 and the pixel circuits 110, the rows are referred to as first, second, third, . . . , (m−1)-th, and m-th rows in order from the top in the figure in some cases. Similarly, in order to differentiate columns in the matrix of the data lines 14 and the pixel circuits 110, the columns are referred to as first, second, third, . . . , (3n−1)-th, and 3n-th columns in order from the left in the figure in some cases. In addition, in order to describe a generalized group of the data lines 14, when an integer j which is 1 or more to n or less is used, the j-th group counted from the left includes the data lines 14 of the (3j−2)-th column, the (3j−1)-th column, and the 3j-th column.

In addition, three pixel circuits 110 corresponding to intersections between the scanning line 12 of the same row and the data lines 14 of three columns belonging to the same group respectively correspond to R, G and B pixels. Therefore, in the present embodiment, a matrix arrangement of the pixel circuits 110 is height m rows×width 3n columns, and is height m rows×width n columns in terms of a dot arrangement of a display image.

For convenience, in some cases, for example, when the data line 14 of the (3j−2)-th column corresponding to R is set to a first data line, the data line 14 of the (3j−1)-th column corresponding to G is referred to as a second data line. In relation to the pixel circuits 110, a pixel circuit corresponding to the R data line 14 (the first data line) is a first pixel circuit, and a pixel circuit corresponding to the G data line 14 (the second data line) is a second pixel circuit.

Meanwhile, the following control signals are supplied from the control circuit 5 to the electro-optical device 10. Specifically, a control signal Ctr for controlling the scanning line driving circuit 20, control signals Sel(1), Sel(2) and Sel (3) for controlling selection in the demultiplexer 30, control signals /Sel(1), /Sel(2) and /Sel(3) having logical inversion relationships with the signals, control signals /Gini, Gref and Gcpl for controlling the level shift circuit 40, and a control signal /Gcpl having a logical inversion relationship with the control signal Gcpl, are supplied to the electro-optical device 10. In addition, the control signal Ctr practically includes a plurality of signals such as a pulse signal, a clock signal, and an enable signal.

Further, data signals Vd(1), Vd(2), . . . and Vd(n) are supplied from the control circuit 5 to the electro-optical device 10 via common terminals 78 corresponding to the first, second, . . . and n-th groups in synchronization with selection timings in the demultiplexer 30.

Here, in the present embodiment, when a grayscale level which defines a grayscale of a pixel to be displayed is designated, for example, in a range from the darkest level 0 to the brightest level 255, the data signals Vd(1) to Vd(n) can be taken in stages from a potential Vmax corresponding to the level 0 to a potential Vmin corresponding to the level 255. Here, since the transistor for controlling a current flowing to the OLED is of a P channel type, the data signal is reduced from the potential Vmax as a designated grayscale level becomes higher.

In addition, a storage capacitor 50 is provided in each of the data lines 14. One end of the storage capacitor 50 is connected to the data line 14, and the other end of the storage capacitor 50 is commonly connected to a voltage supply line 16 of a constant potential, for example, a potential Vorst. As the storage capacitor 50, a parasitic capacitor of the data line 14 may be used, or a coupling capacitor between the parasitic capacitor and a capacitive element formed by interposing an insulator (a dielectric) between a line constituting the data line 14 and a separate line may be used. Here, a capacitance of the storage capacitor 50 is indicated by Cdt.

The scanning line driving circuit 20 generates scanning signals for scanning the scanning lines 12 for each row during a frame period, in response to the control signal Ctr. Here, the scanning signals supplied to the scanning lines 12 of the first, second, third, . . . , (m−1)-th and m-th rows are indicated by Gwr(1), Gwr(2), Gwr(3), Gwr(m−1), and Gwr(m), respectively.

Additionally, in addition to the scanning signals Gwr(1) to Gwr(m), the scanning line driving circuit 20 generates various control signals synchronized with the scanning signals for each row and supplies the generated control signals to the display unit 100, but the control signals are not shown in FIG. 2. Further, the frame period refers to a period when the electro-optical device 10 is required to display an image corresponding to one cut (scene), and is a period of 8.3 milliseconds corresponding to one cycle, for example, when the frequency of the vertical synchronization signal included in the synchronization signal is 120 Hz.

The demultiplexer 30 is an array of transmission gates 34 provided in the respective columns. Input ends of the transmission gates 34 corresponding to the (3j−2)-th column, the (3j−1)-th column, and 3j-th column belonging to the j-th group are connected to the common terminal 78 and are supplied with the data signal Vd(j) in a time-division manner.

The transmission gate 34 provided in the (3j−2)-th column which is the leftmost column in the j-th group is turned on (conducted) when the control signal Sel(1) is in a high (H) level (the control signal /Sel(1) is in a low (L) level). Similarly, the transmission gate 34 provided in the (3j−1)-th column which is the central column in the j-th group is turned on when the control signal Sel(2) is in an H level (the control signal /Sel(2) is in an L level), and the transmission gate 34 provided in the 3j-th column which is the rightmost column in the j-th group is turned on when the control signal Sel(3) is in an H level (the control signal /Sel(3) is in an L level).

The level shift circuit 40 shifts a potential of a data signal in a direction in which a potential amplitude of the data signal output from the output end of the transmission gate 34 of each column is compressed. For this reason, the level shift circuit 40 includes a set of a storage capacitor 41, a transmission gate 42, an N channel type transistor 43, a storage capacitor 44, and a P channel type transistor 45, for each column.

In each column, the output end of the transmission gate 34 of the demultiplexer 30 is connected to one end of the storage capacitor 41 of the level shift circuit 40 and the input end of the transmission gate 42 of the level shift circuit 40. The other end of the storage capacitor 41 is connected to the common ground Gnd of which a potential is fixed in each column.

In addition, in relation to a voltage, a potential of the ground Gnd is used as a reference of 0 V unless otherwise mentioned such as a both-end voltage of the storage capacitor, a voltage between a gate and a source, and a voltage between an anode and a cathode of an OLED 150.

The transmission gate 42 of each column is turned on when the control signal Gcpl is in an H level (the control signal /Gcpl is in an L level). The output end of the transmission gate 42 is connected to the data line 14 via the storage capacitor 44.

Here, for convenience, in relation to one end and the other end of the storage capacitor 44, it is assumed that one end is located on the data line 14 side, and the other end is located on the transmission gate 42 side. At this time, one end of the storage capacitor 44 is connected to a drain node of the transistor 45 as well as the data line 14, and the other end of the storage capacitor 44 is connected to a drain node of the transistor 43.

Although not shown in FIG. 2 for convenience of description, a capacitance of the storage capacitor 44 is indicated by Cref1, and the other end of the storage capacitor 44 is indicated by a node h. In addition, in a case where the storage capacitors 44 are differentiated from each other by columns, the storage capacitor corresponding to an R column is a first storage capacitor, and the storage capacitor corresponding to a G column is a second storage capacitor.

Further, as shown in FIG. 2, the voltage supply line 16 is provided so as to extend longitudinally through the level shift circuit 40.

In relation to the transistors 43, source nodes thereof are commonly connected to a voltage supply line 62 which supplies a potential Vref as a predetermined reference potential over the respective columns, and gate nodes thereof are commonly connected to a control line 64 to which the control signal Gref is supplied over the respective columns. For this reason, the node h is electrically connected to the voltage supply line 62 when the transistor 45 is turned on in an H level of the control signal Gref, and is electrically disconnected therefrom when the transistor 45 is turned off in an L level of the control signal Gref.

In addition, the source nodes of the transistors 45 are commonly connected to a voltage supply line 61 which supplies a potential Vini as an initial voltage over the respective columns, and the gate nodes thereof are commonly connected to a control line 63 to which the control signal /Gini is supplied over the respective columns. For this reason, the data line 14 is electrically connected to the voltage supply line 61 when the transistor 45 is turned on in an L level of the control signal /Gini, and is electrically disconnected therefrom when the transistor 45 is turned off in an H level of the control signal /Gini.

In the present embodiment, the scanning line driving circuit 20, the demultiplexer 30, and the level shift circuit 40 are divided for convenience, but they are collectively conceivable as a driving circuit for driving the pixel circuits 110.

The pixel circuit 110 will be described with reference to FIG. 3. The respective pixel circuits 110 have the electrically same configuration, and, thus, here, the pixel circuit 110 of i-th row and the (3j−2)-th column which is located in the i-th row and in the leftmost (3j−2)-th column in the j-th group will be described as an example.

Figure 3:
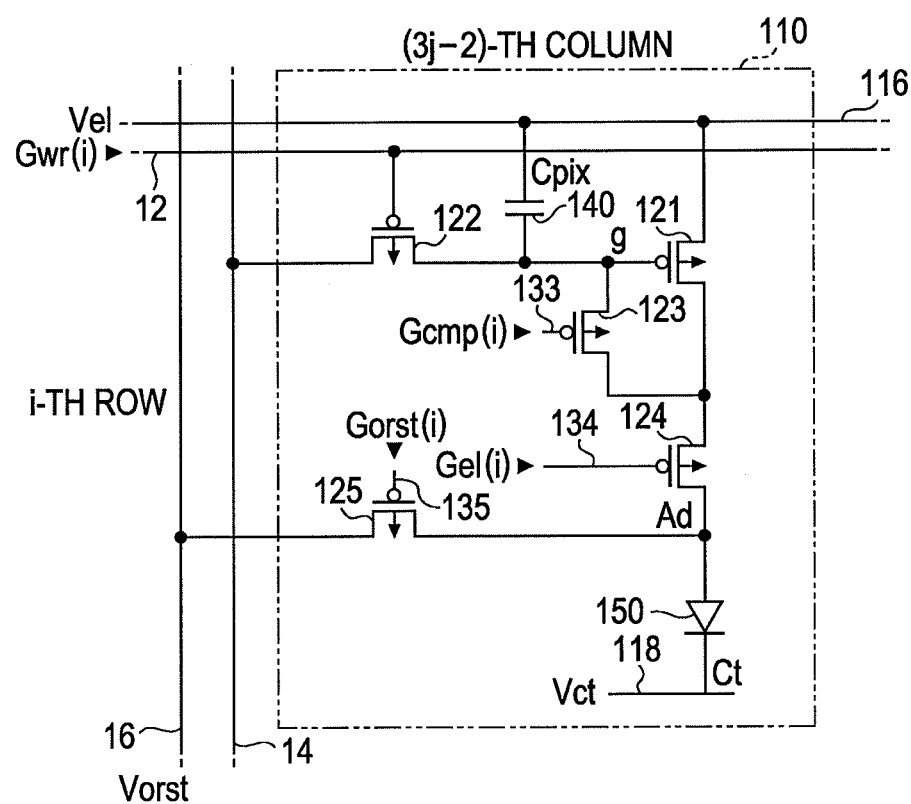
FIG. 3 is a diagram illustrating a pixel circuit in the electro-optical device.

In addition, FIG. 3 shows an equivalent circuit of the pixel circuit 110, and is not a diagram which reflects a practical circuit layout. Further, i is a reference sign which generally indicates a row in which the pixel circuit 110 is arranged and is an integer which is 1 or more to m or less.

As shown in FIG. 3, the pixel circuit 110 includes P channel type transistors 121 to 125, a storage capacitor 140, and an OLED 150. The pixel circuit 110 is supplied with a scanning signal Gwr(i), and control signals Gel(i), Gcmp(i) and Gorst (i). Here, the scanning signal Gwr(i) and the control signals Gel(i), Gcmp(i) and Gorst(i) are supplied by the scanning line driving circuit 20 so as to correspond to the i-th row. Among them, the control signal Gel(i) is supplied via a control line 134, and, similarly, the control signals Gcmp(i) and Gorst(i) are respectively supplied via control lines 133 and 135.

In addition, the scanning signal Gwr(i) and the control signals Gel(i), Gcmp(i) and Gorst(i) are supplied so as to correspond to the i-th row, and are thus commonly supplied to other pixel circuits of columns other than the target (3j−2)-th column if located in the i-th row.

Meanwhile, in the transistor 122 of the pixel circuit 110 of the i-th row and the (3j−2)-th column, a gate node thereof is connected to the scanning line 12 of i-th row, one of a drain node and a source node thereof is connected to the data line 14 of the (3j−2)-th column, and the other thereof is connected to a gate node of the transistor 121, one end of the storage capacitor 140, and a drain node of the transistor 123. Here, the gate node of the transistor 121 is indicated by g so as to be differentiated from the other nodes.

In the transistor 121, a source node thereof is connected to a voltage supply line 116, and a drain node thereof is connected to a source node of the transistor 123 and a source node of the transistor 124. Here, the voltage supply line 116 supplies a potential Vel which is a high potential side of a power supply in the pixel circuit 110.

A gate node of the transistor 123 is connected to a control line 133 of the i-th row and is supplied with the control signal Gcmp(i).

A gate node of the transistor 124 is connected to a control line 134 of the i-th row and is supplied with the control signal Gel(i), and a drain node thereof is connected to a source node of the transistor 125 and an anode Ad of the OLED 150.

A gate node of the transistor 125 is connected to a control line 135 of the i-th row and is supplied with the control signal Gorst(i) corresponding to the i-th row, and a drain node thereof is connected to the voltage supply line 16 corresponding to the (3j−2)-th column and is maintained at a potential Vorst.

In addition, in the transistors 121 to 125, potential relationship may be changed due to a change in a channel type or the like. In a case where the potential relationship is changed, a node described as a drain node may become a source node, and a node described as a source node may become a drain node. For example, one of the source node and the drain node of the transistor 121 may be electrically connected to the voltage supply line 116 and the other thereof may be electrically connected to the anode Ad of the OLED 150 via the transistor 123.

The other end of the storage capacitor 140 is connected to the voltage supply line 116. Therefore, the storage capacitor 140 stores a voltage between the source and the drain of the transistor 121. Here, when a capacitance of the storage capacitor 140 is indicated by Cpix, the capacitance Cdt of the storage capacitor 50, the capacitance Cref1 of the storage capacitor 44, and the capacitance Cpix of the storage capacitor 140 are set to be Cdt and Cref1≫Cpix.

In other words, Cpix is sufficiently smaller than Cdt and Cref1. In addition, Cref2 is approximately the same as Cref1 or slightly smaller than Cref1. Further, as the storage capacitor 140, a parasitic capacitor of the gate node g of the transistor 121 may be used, or a capacitor formed by interposing an insulating layer between different conductive layers in a semiconductor silicon substrate may be used.

The anode Ad of the OLED 150 is a pixel electrode which is individually provided for each pixel circuit 110. In contrast, a cathode Ct of the OLED 150 is a common electrode 118 which is common to all the pixel circuits 110, and is maintained at a potential Vct which is a low potential side of the power supply in the pixel circuit 110.

Therefore, the source and the drain of the transistor 121 and the OLED 150 are electrically connected in series via the transistor 124 between the potential Vel which is a high potential side of the power supply and the potential Vct which is a low potential side.

The OLED 150 is a two-terminal element in which a white organic EL layer is interposed between the anode Ad and the light transmissive cathode Ct in the semiconductor silicon substrate. In addition, a color filter may overlap any one of RGB on an emission side (a cathode side) of the OLED 150.

When a current flows from the anode Ad to the cathode Ct in the OLED 150 with this structure, holes injected from the anode Ad and electrons injected from the cathode Ct are recombined in the organic EL layer so as to generate excitons, thereby emitting white light. The white light emitted at this time passes through the cathode on an opposite side to the semiconductor silicon substrate (the anode), is colored by the color filter, and is visible on an observer side (a top emission structure).

In addition, in the present embodiment, since the electro-optical device 10 is formed on the semiconductor silicon substrate, a substrate potential of the transistors 121 to 125 is not shown in FIG. 3 but is set to the potential Vel.

In this configuration, if a potential of one end and a potential of the other end of the storage capacitor 44 which is electrically inserted into a supply path of a data signal are shifted from target values, display quality deteriorates. As described above, if the electro-optical device 10 is miniaturized, variations in potentials of the columns adjacent to each other propagate due to the capacitive coupling, and thus deterioration in display quality tends to occur.

For this reason, the present embodiment has a configuration in which one end and the other end of the storage capacitor 44 are shielded by constant potential lines and are thus hard to be influenced by potential variations of the columns adjacent to each other.

For description of this configuration, a manufacturing process of the electro-optical device 10 is necessary as a preliminary knowledge. Therefore, first, the manufacturing process of the electro-optical device 10 will be described briefly.

In the electro-optical device, first, for example, after an N well region with an island shape which is a base of a P channel type transistor is formed in a P type semiconductor silicon substrate, a first conductive layer such as a poly-crystalline silicon film is patterned via a gate insulating film so as to form a first wire such as a gate. Successively, a region where the P channel type transistor is formed is protected by a resist, and then ions are implanted using the resist or the gate wire as a mask so as to an N type diffusion layer which becomes a source node and a drain node of an N channel type transistor. Next, a region where the N channel type transistor is formed is protected by a resist, and then ions are implanted using the resist or the gate wire as a mask so as to a P type diffusion layer which becomes a source node and a drain node of a P channel type transistor.

Next, a conductive layer (a second conductive layer) such as aluminum or copper is patterned via a first interlayer insulating film, and thereby a variety of wires described later are provided as a second wire. At this time, the second wire is connected to the first wire or the source node and the drain node via contact holes which are opened in the first interlayer insulating film.

Successively, a conductive layer (a third conductive layer) such as the same aluminum or copper is patterned via a second interlayer insulating film, and thereby a variety of wires are provided as a third wire. At this time, the third wire is connected to the second wire via contact holes which are opened in the second interlayer insulating film.

In addition, a rectangular pixel electrode is formed as the anode Ad of the OLED 150 via a third interlayer insulating film and a light blocking layer. The subsequent procedures are not directly related to the invention, and thus description thereof will be omitted.

How the pixel circuit 110 of the display unit 100 or the level shift circuit 40 which is a peripheral circuit is configured through this manufacturing process will be described individually.

In addition, in the following FIGS. 4 to 9, scales are appropriately changed in order to describe a structure, and thus aspect ratios are not necessarily the same as the scales.

Pixel Circuit

Figure 4:
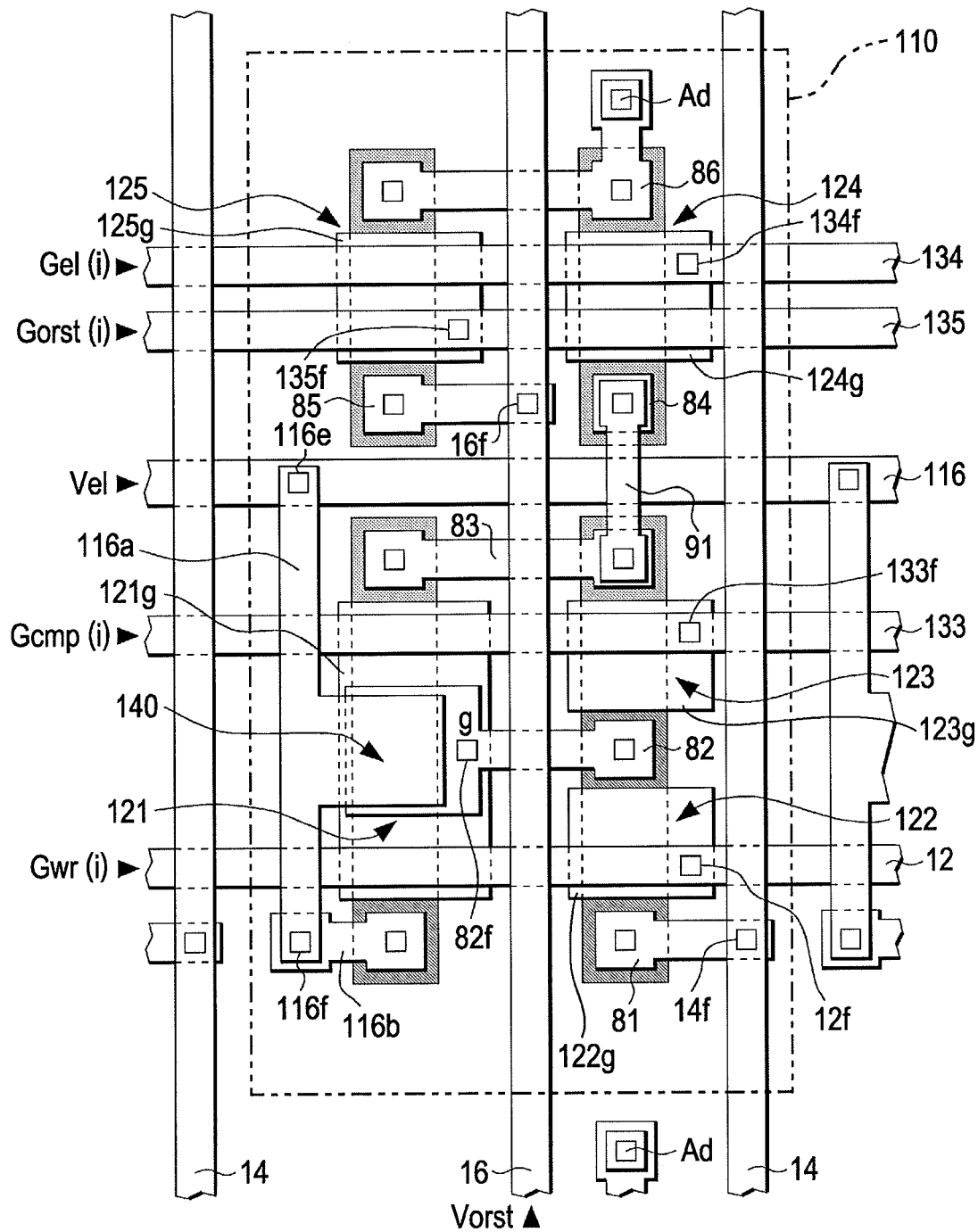
FIG. 4 is a plan view illustrating a configuration of the pixel circuit.
Figure 5:
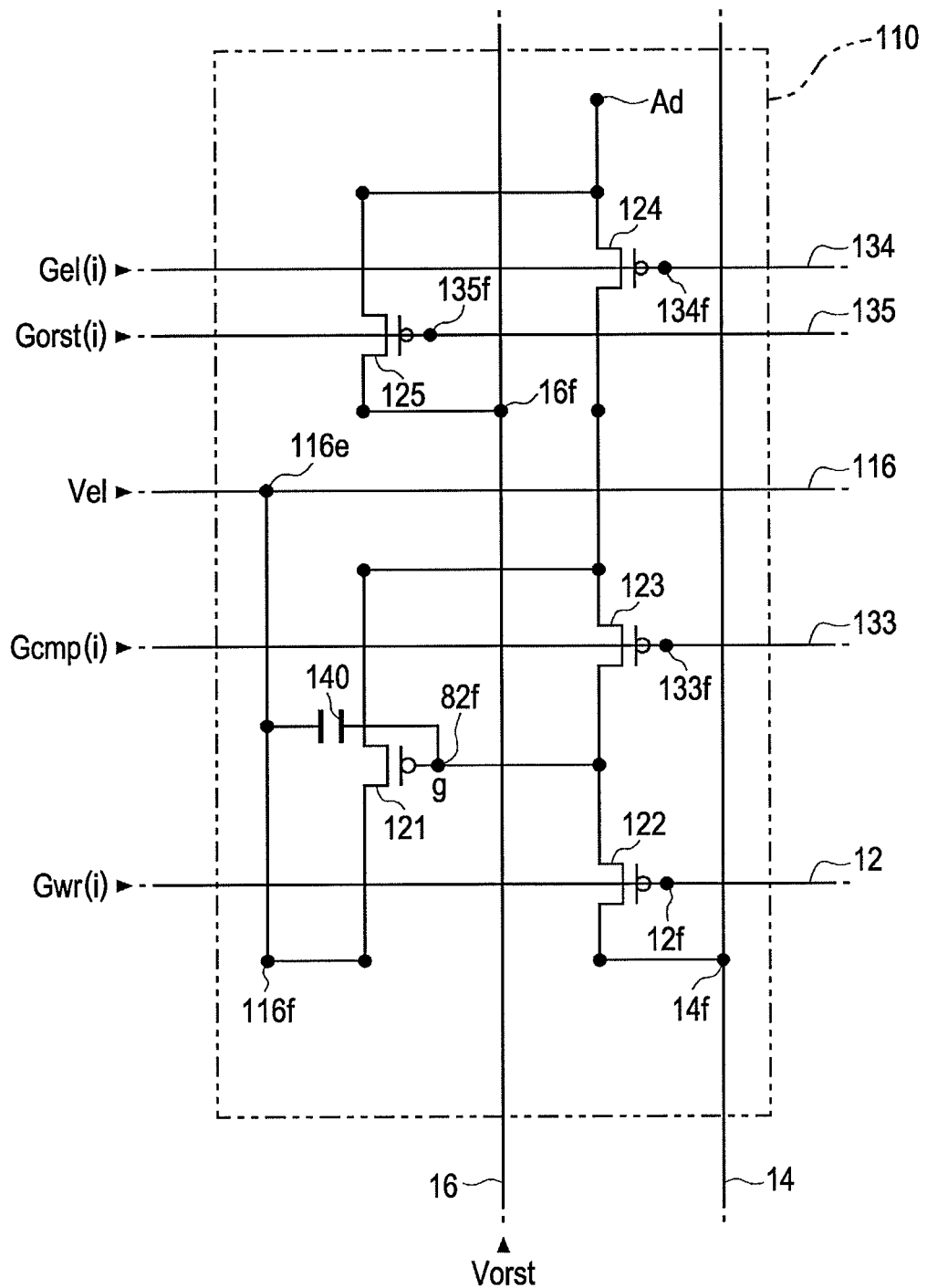
FIG. 5 is a plan view illustrating an equivalent circuit in FIG. 4.

FIG. 4 is a plan view when the pixel circuit 110 of a top emission structure is viewed from an observation side, and shows various wires such as the first wire, the second wire, and the third wire. In addition, FIG. 5 is an explanatory diagram in which the structure in FIG. 4 is replaced with a circuit, and is the same as FIG. 3 in terms of a circuit.

As shown in FIG. 4, in the pixel circuit 110, first, the transistors 121 to 125 are provided, and gate wires 121g to 125g are formed as the first wire by patterning the first conductive layer.

The transistor 121 has a rectangular shape which is long in the column direction (an extending direction of the data line 14) in plan view, and has the gate wire 121g which is formed via an insulating layer for the N well and two P type diffusion layers (the hatched regions in the figure). Of the two diffusion layers of the transistor 121, the lower side of the figure is a source node, and the upper side is a drain node.

The transistors 122 and 123 are disposed on the right side of the transistor 121 in the figure and have a rectangular shape which is long in the column direction in plan view. In the transistors 122 and 123, the gate wires 122g and 123g which are separated from each other are formed, and three P type diffusion layers are formed. Among the three diffusion layers, the lower side of the figure is one of a drain node and a source node of the transistor 122, the center is a common node of the other of the drain node and the source node of the transistor 122 and a drain node of the transistor 123, and the upper side is a source node of the transistor 123.

As shown in FIG. 4, the transistor 124 has a rectangular shape which is long in the column direction in plan view, and is disposed at a location which is arranged with the transistors 122 and 123 in the column direction. In the transistor 124, the gate wire 124g is formed and two P type diffusion layers are formed. Of the two diffusion layers, the lower side of the figure is a source node of the transistor 124, and the upper side is a drain node thereof.

The transistor 125 is located on the left side of the transistor 124 in the figure, and is disposed at a location which is arranged with the transistor 121 in the column direction. In the transistor 125, the gate wire 125g is formed and two P type diffusion layers are formed. Of the two diffusion layers, the lower side of the figure is a drain node of the transistor 125, and the upper side is a source node thereof.

The first interlayer insulating film is provided with respect to the transistors 121 to 125 provided in this way, and then the second conductive layer is patterned so as to provide the second wire described below. In other words, the scanning line 12, the wires 81 to 86, the voltage supply line 116, the wire 116b, and the control lines 133 to 135 are provided as the second wire. Among them, the scanning line 12, the voltage supply line 116, and the control lines 133 to 135 are provided so as to extend in the row direction.

The scanning line 12 passes over the upper side (the front side of the figure) of the gate wire 122g. The scanning line 12 is connected to the gate wire 122g via a contact hole (a via-hole, indicated by □ in the FIG. 12f which is opened in the first interlayer insulating film. The control line 133 passes over the upper side of the gate wire 123g and is connected to the gate wire 123g via a contact hole 133f.

The voltage supply line 116 is provided so as to extend in the row direction in the boundaries between the transistors 121 to 123 and the transistors 124 and 125 in plan view. The control lines 134 and 135 respectively pass over the upper sides of the gate wires 124g and 125g, and, of the two, the control line 134 is connected to the gate wire 124g via a contact hole 134f, and the control line 135 is connected to the gate wire 125g via a contact hole 135f.

The wire 81 has one end connected to the data line 14 and the other end connected to one of the drain node and the source node of the transistor 122.

The wire 82 has one end connected to the common node of the transistors 122 and 123 and the other end connected to the gate wire 121g of the transistor 121 via a contact hole 82f. The wire 82 has a large width on the upper side of the gate wire 121g, and constitutes one of a pair of electrodes of the storage capacitor 140.

The wire 83 has one end connected to the drain node of the transistor 121 and the other end connected to the source node of the transistor 123.

The wire 84 is a relay electrode for connecting the source node of the transistor 124 to a wire 91 of a second wire layer described later. The wire 85 has one end connected to the drain node of the transistor 125. The wire 86 is connected to the drain node of the transistor 124, the source node of the transistor 125, and the anode Ad of the OLED 150 (not shown in FIGS. 4 and 5).

The wire 116b is a relay wire for connecting the source node of the transistor 121 to the voltage supply line 116 via a wire 116a of the second wire layer described later.

After the second interlayer insulating film is provided with respect to the second wire, the third conductive layer is patterned such that the data lines 14, the voltage supply line 16, and the wires 91 and 116a are provided as the third wire.

The data lines 14 and the voltage supply line 16 are provided so as to extend in the column direction. The data line 14 is disposed on the right side of the transistors 122 to 124 in plan view, and is connected to the other end of the wire 81 via a contact hole 14f opened in the second interlayer insulating film. Thereby, the data line 14 is connected to one of the drain node and the source node of the transistor 122 via the wire 81.

The voltage supply line 16 is disposed between the transistors 122, 123 and 124 and the transistors 121 and 125 in plan view, and is connected to the other end of the wire 85 via a contact hole 16f. Thereby, the voltage supply line 16 is connected to the drain node of the transistor 125 via the wire 85.

On the other hand, the wire 116a is provided on the left side of the transistor 121 in plan view, and is connected to the voltage supply line 116 via a contact hole 116e and is connected to the wire 116b via a contact hole 116f in a state of crossing over the control line 133 and the scanning line 12. Thereby, the voltage supply line 116 is connected to the source node of the transistor 121 via the wires 116a and 116b.

In addition, the wire 116a is formed so as to overlap the wire 82 in plan view, and constitutes the other of a pair of electrodes of the storage capacitor 140. Thereby, the storage capacitor 140 has a configuration in which the second interlayer insulating film is interposed between the wire 82 and the wire 116a.

The wire 91 connects the wires 83 and 84 to each other in a state of crossing over the voltage supply line 116. Thereby, the drain node of the transistor 121, the drain node of the transistor 123, and the source node of the transistor 124 are connected to each other.

In this way, in the pixel circuit 110, the transistors 121 to 123 and the transistors 124 and 125 become distant from each other by the voltage supply line 116 of the potential Vel. In addition, in relation to the gate node g of the transistor 121, the left side of the figure is shielded by the wire 116a, and the right side is shielded by the voltage supply line 16.

Level Shift Circuit

Figure 6:
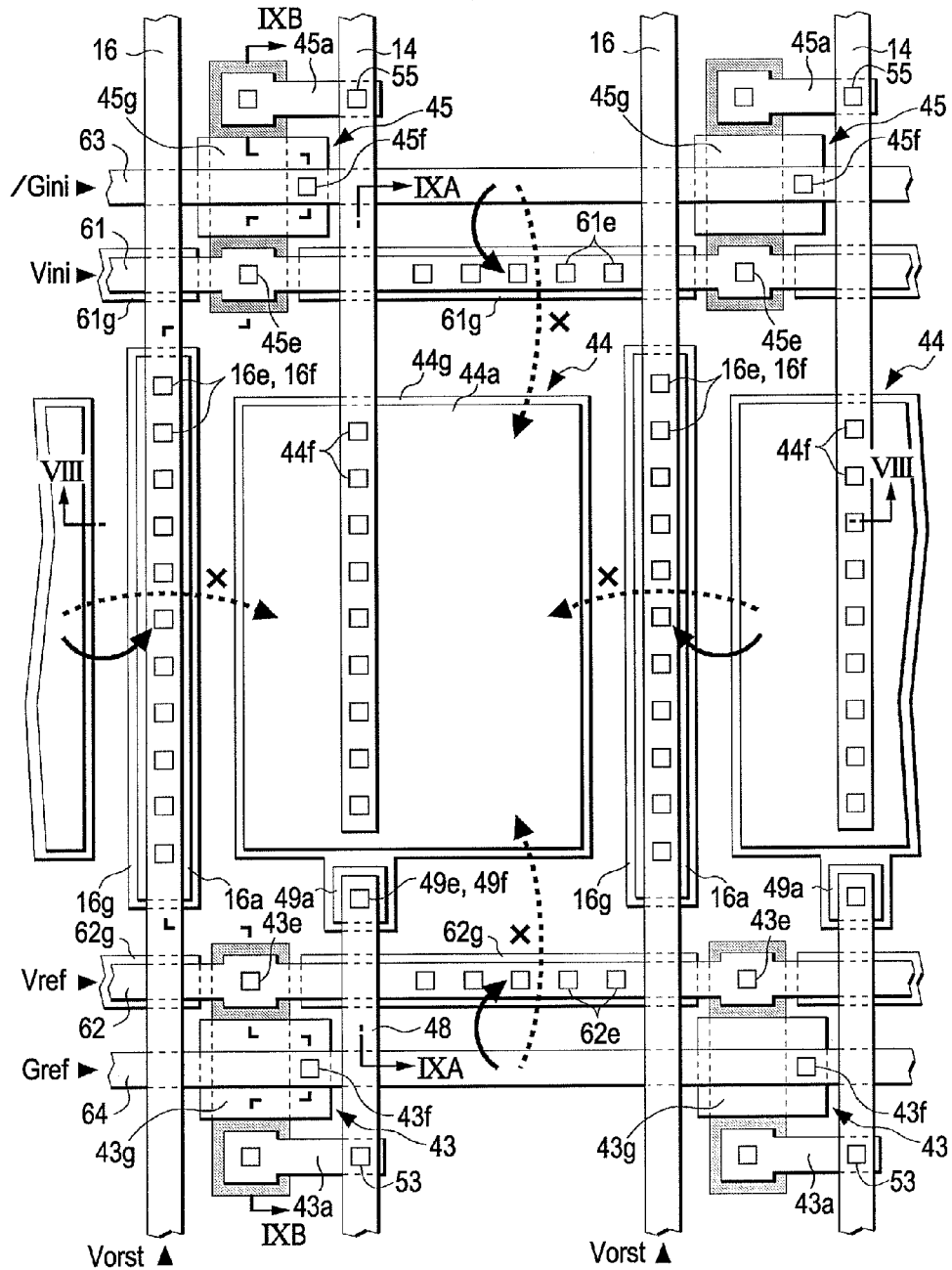
FIG. 6 is a plan view illustrating a configuration of main parts of a level shift circuit of the electro-optical device.

FIG. 6 is a plan view when regions where the transistors 43 and 45 and the storage capacitor 44 are formed in the level shift circuit 40 are viewed from the observation side, and shows various wires such as the first wire, the second wire, and the third wire.

Figure 7:
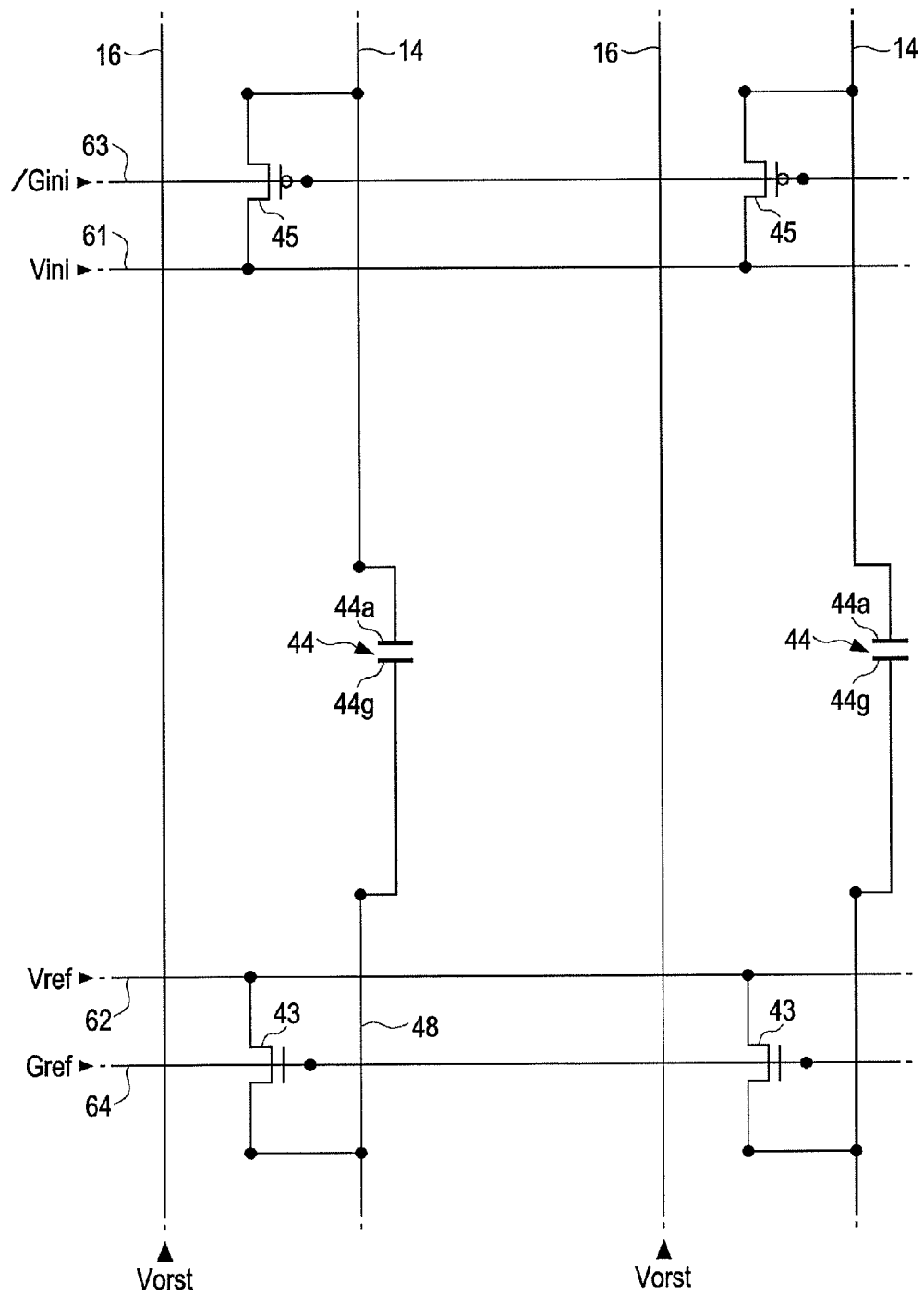
FIG. 7 is a plan view illustrating an equivalent circuit in FIG. 6.

In FIG. 6, the various wires are formed in a process common to the pixel circuit 110. FIG. 7 is an explanatory diagram in which the structure in FIG. 6 is replaced with a circuit.

Figure 8:
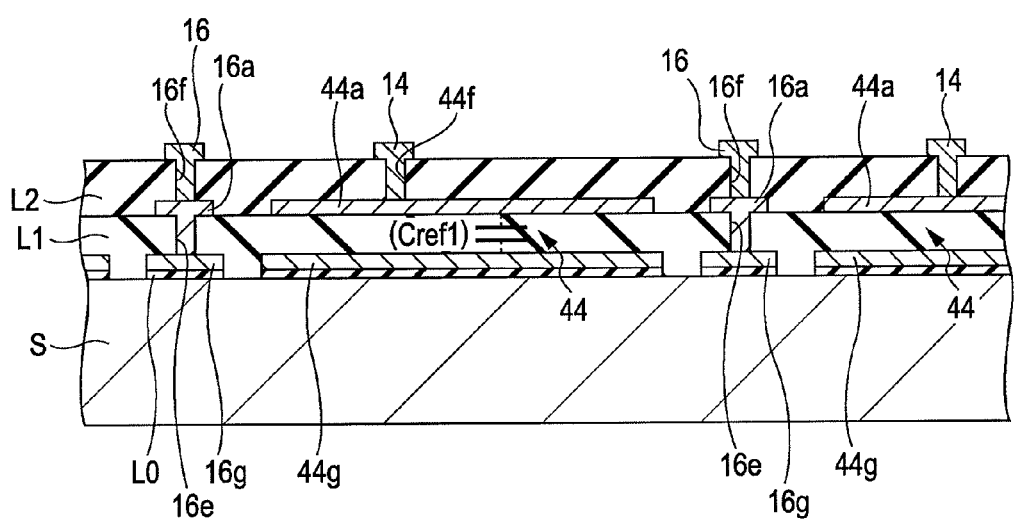
FIG. 8 is a partial cross-sectional view taken along the line VIII-VIII in FIG. 6.
Figure 9A:
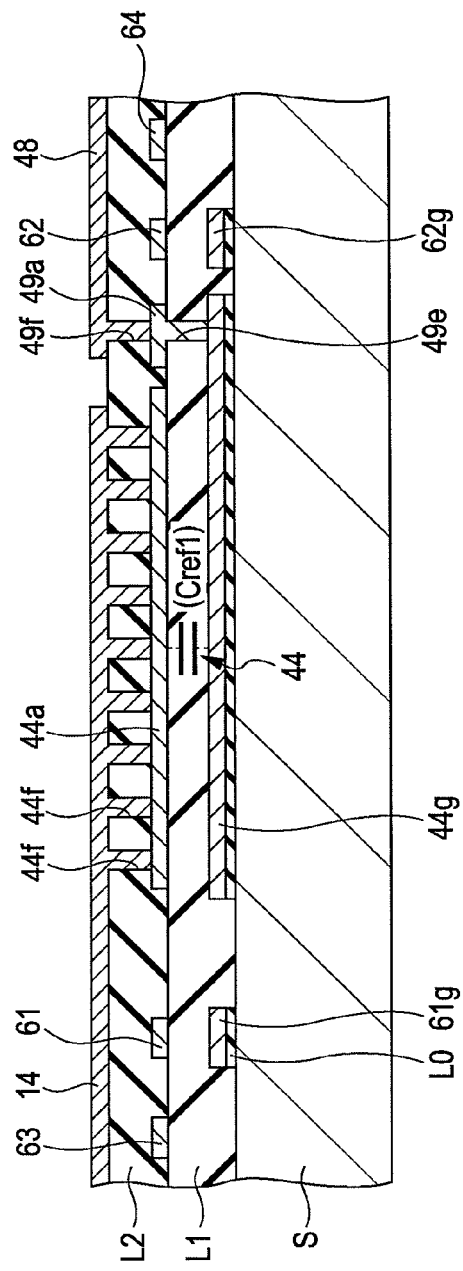
FIGS. 9A and 9B are partial cross-sectional views taken along the lines IXA-IXA and IXB-IXB in FIG. 6, respectively.
Figure 9B:
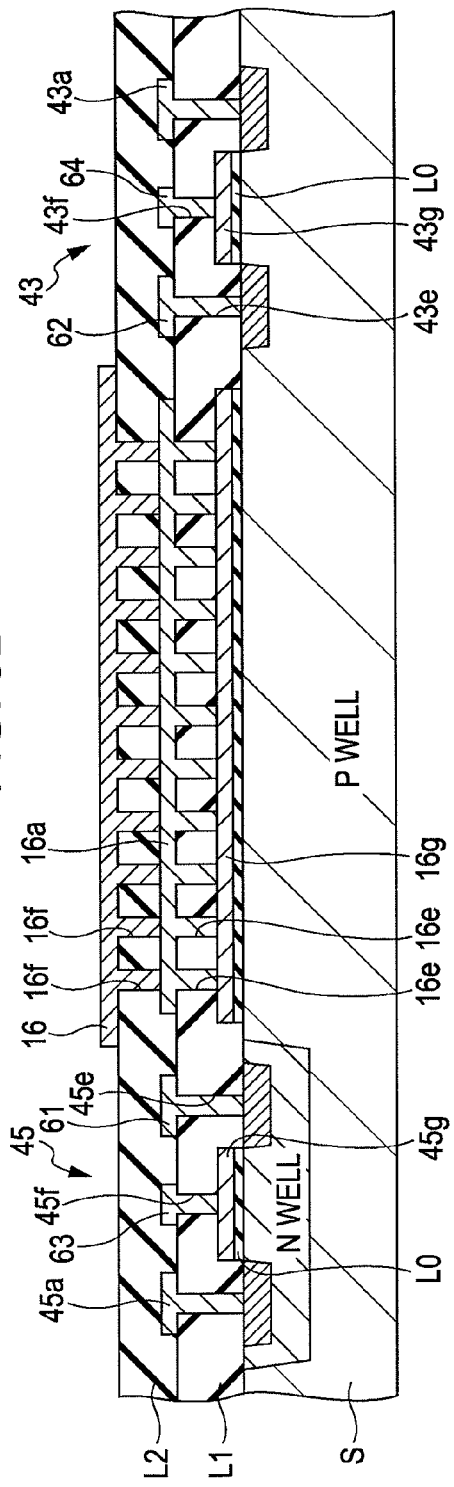

In addition, FIG. 8 is a partial cross-sectional view taken along the line VIII-VIII in FIG. 6, FIG. 9A is a partial cross-sectional view taken along the line IXA-IXA in FIG. 6, and FIG. 9B is a partial cross-sectional view taken along the line IXB-IXB in FIG. 6. Further, in the following, the plan view of FIG. 6 will be described as a main diagram, and the partial cross-sectional views of FIGS. 8 to 9B will be described as a subsidiary diagram.

In FIG. 6, schematically, the storage capacitor 44 is provided at one end of the data line 14, and voltage supply lines 16 are provided so as to extend on the left and right sides thereof.

In the figure, the transistor 43 is provided on the lower side (the demultiplexer 30 side), and the transistor 45 is provided on the upper side (the display unit 100 side). The transistors 43 and 45 have a rectangular shape which is long in the column direction in plan view in the same manner as the transistors 121 to 125 of the pixel circuit 110. In addition, gate wires 43g and 45g, wires 16g, 61g and 62g, and an electrode 44g are formed as the first wire by patterning the first conductive layer.

Particularly, as shown in FIG. 9B, the transistor 43 has the gate wire 43g formed via an insulating film L0 and two N type diffusion layers in a P type semiconductor silicon substrate S (P well). Of the two diffusion layers of the transistor 43, the right side (the lower side of FIG. 6) of FIG. 9B is a drain node, and the left side (the upper side of FIG. 6) is a source node.

The transistor 45 has the gate wire 45g formed via an insulating film L0 and two P type diffusion layers in an N well. Of the two diffusion layers of the transistor 45, the right side is a source node, and the left side is a drain node.

On the other hand, the wire 16g is provided between the voltage supply lines 61 and 62 formed in the row direction in the region where the voltage supply line 16 is formed in the column direction. The wire 62g is provided between the source nodes of the transistors 43 in the respective columns in the region where the voltage supply line 62 is formed in the row direction. The wire 61g is provided between the source nodes of the transistors 45 in the respective columns in the region where the voltage supply line 61 is formed in the row direction.

The electrode 44g is the other end of the storage capacitor 44, and has a rectangular shape which is long in the column direction as shown in the figure.

After a first interlayer insulating film L1 is provided with respect to the transistors 43 and 45, the voltage supply lines 61 and 62, the control lines 63 and 64, the wires 43a, 45a, 49a and 16a, and the electrode 44a are formed as the second wire by patterning the second conductive layer. Among them, the voltage supply lines 61 and 62 and the control lines 63 and 64 are provided so as to extend in the row direction.

The voltage supply line 62 is provided over the upper side of the wire 62g, and is connected to the source node of the transistor 43 via a contact hole 43e opened in the first interlayer insulating film L1. In addition, the voltage supply line 62 is connected to the wire 62g via a contact hole 62e. For this reason, the voltage supply line 62 partially has a two-layer structure in which the wire 62g is a lower layer. The control line 64 is provided so as to pass over the upper side of the gate wire 43g, and is connected to the gate wire 43g via a contact hole 43f opened in the first interlayer insulating film. One end of the wire 43a is connected to the drain node of the transistor 43 via a contact hole.

On the other hand, the voltage supply line 61 is provided over the upper side of the wire 61g, and is connected to the source node of the transistor 45 via a contact hole 45e. In addition, the voltage supply line 61 is connected to the wire 61g via a contact hole 61e. For this reason, the voltage supply line 61 partially has a two-layer structure in which the wire 61g is a lower layer. The control line 63 is provided so as to pass over the upper side of the gate wire 45g, and is connected to the gate wire 45g via a contact hole 45f. One end of the wire 45a is connected to the drain node of the transistor 45 via a contact hole.

The wire 49a relays the electrode 44g which constitutes the other end of the storage capacitor 44 to the wire 48 described later, and is connected to the electrode 44a via a contact hole 49e.

The wire 16a is provided over the upper side of the wire 16g, and is connected to the wire 16g via a plurality of contact holes 16e.

The electrode 44a overlaps the electrode 44g and is one end of the storage capacitor 44. The first interlayer insulating film L1 is interposed between the electrode 44g and the electrode 44a as shown in FIG. 9A, thereby forming the storage capacitor 44.

After a second interlayer insulating film L2 is provided with respect to the second wire, the data line 14, the voltage supply line 16, and the wire 48 are provided as the third wire by patterning the third conductive layer.

The data line 14 is connected to the electrode 44a via a plurality of contact holes 44f opened in the second interlayer insulating film L2. In addition, the data line 14 is connected to the other end of the wire 45a via a contact hole 55. Thereby, the data line 14 is connected to the drain node of the transistor 45 via the contact hole 55 and the wire 45a in order.

The voltage supply line 16 is connected to the wire 16a via a plurality of contact holes 16f. Thereby, the voltage supply line 16 partially has a three-layer structure using the wires 16g and 16a. Therefore, the voltage supply lines 16 of the three-layer structure are respectively disposed as a shield wire on both the left and right sides of the storage capacitor 44.

The wire 48 is lead from the output end of the transmission gate 42 (refer to FIG. 2), and is connected to the wire 49a via a contact hole 49f. For this reason, the wire 48 is connected to the electrode 44g which is the other end of the storage capacitor 44 through the relay of the wire 49a. In addition, the wire 48 is connected to the other end of the wire 43a via a contact hole 53. Thereby, the wire 48 is connected to the drain node of the transistor 43 via the contact hole 43 and the wire 43a in order.

In this way, in the level shift circuit 40, when viewed in FIG. 6, with respect to the storage capacitor 44, the voltage supply lines 16 are provided on the left and right sides, the voltage supply line 61 is provided on the upper side, and the voltage supply line 62 is provided on the lower side. Therefore, the four sides of the storage capacitor 44 are respectively shielded by the constant potential lines.

Operation According to First Embodiment

Figure 10:
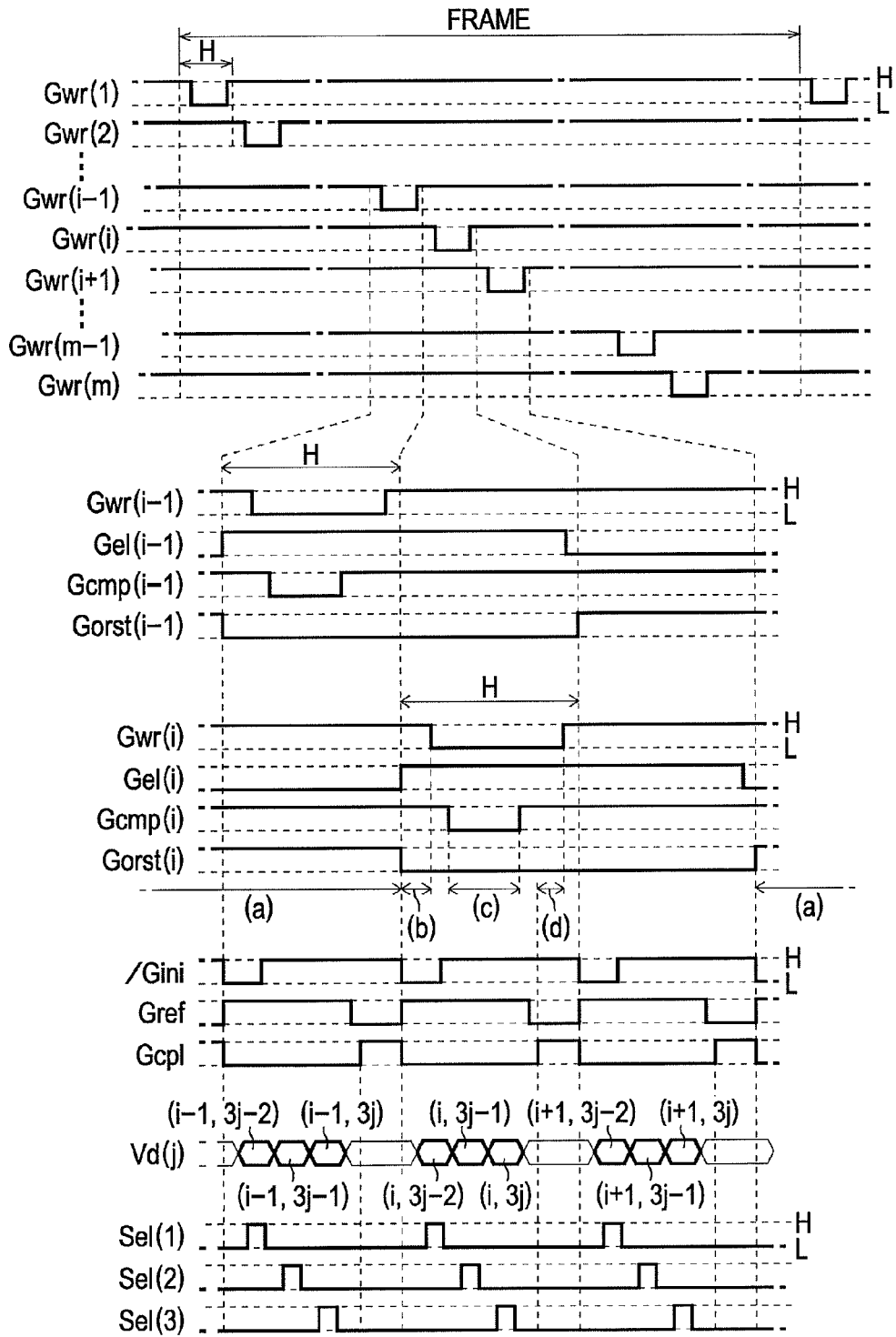
FIG. 10 is a timing chart illustrating an operation of the electro-optical device.

An operation of the electro-optical device 10 will be described with reference to FIG. 10. FIG. 10 is a timing chart illustrating an operation of each part of the electro-optical device 10.

As shown in this figure, the scanning signals Gwr(1) to Gwr(m) are sequentially changed to an L level, and thereby the scanning lines 12 of the first to m-th rows are scanned for each horizontal scanning period (H) during one frame period.

An operation in one horizontal scanning period (H) is the same in the pixel circuits 110 of each row. Therefore, the operation will be described paying attention to, particularly, the pixel circuit 110 of the i-th row and the (3j−2)-th column in a scanning period when the i-th row is horizontally scanned.

The scanning period of the i-th row may be largely divided into an initialization section indicated by (b), a compensation section indicated by (c), and a writing section indicated by (d) in FIG. 10. In addition, an emission section indicated by (a) follows the writing section of (d) with a gap, and the scanning period of the i-th row arrives after one frame period has elapsed. For this reason, in temporal order, a cycle of the (emission section), the initialization section, the compensation section, the writing section, and the (emission section) is repeated.

In addition, in FIG. 10, the scanning signal Gwr(i−1), the control signal Gel(i−1), Gcmp(i−1) and Gorst(i−1) corresponding to the (i−1)-th row which precedes the i-th row by one row have waveforms which temporally precede the scanning signal Gwr(i), the control signal Gel(i), Gcmp(i) and Gorst(i) corresponding to the i-th row by one horizontal scanning period (H).

Emission Section

For convenience of description, the emission section which is a premise of the initialization section will be first described. As shown in FIG. 10, in the emission section of the i-th row, the scanning signal Gwr(i) is in an H level, and, among the control signal Gel(i), Gcmp(i) and Gorst(i) which are logic signals, the control signal Gel(i) is in an L level, and the control signal Gcmp(i) and Gorst(i) are in an H level.

Figure 11:
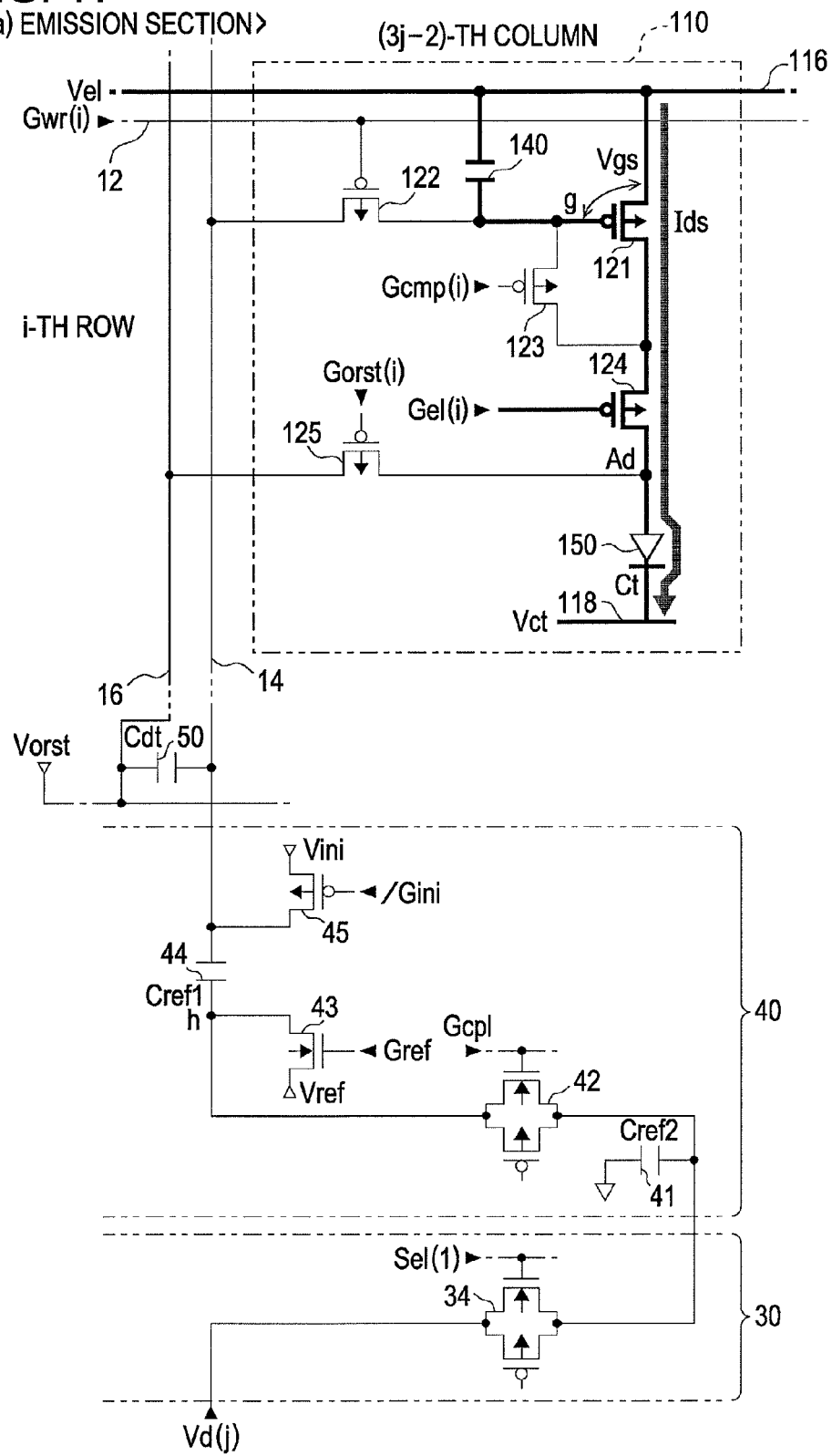
FIG. 11 is a diagram illustrating an operation of the electro-optical device.

For this reason, as shown in FIG. 11, in the pixel circuit 110 of the i-th row and the (3j−2)-th column, the transistor 124 is turned on, and the transistors 122, 123 and 125 are turned off. Therefore, the transistor 121 functions as a driving transistor which supplies a current Ids corresponding to a voltage Vgs between the gate and the source to the OLED 150. As described later, in the present embodiment, the voltage Vgs in the emission section is a value of which a level is shifted corresponding to a data signal from a threshold voltage of the transistor 121. Therefore, a current corresponding to a gray-scale level is supplied to the OLED 150 in a state of compensating the threshold voltage of the transistor 121.

In addition, the emission section of the i-th row corresponds to a period when the rows other than the i-th row are horizontally scanned, and thus a potential of the data line 14 appropriately varies. However, since the transistor 122 is turned off in the pixel circuit 110 of the i-th row, the potential variation of the data line 14 is not considered here. Further, in FIG. 11, a path which is important in describing the operation is indicated by the thick solid line (this is the same for the following FIGS. 12 to 14).

Initialization Section

Next, when the scanning period of the i-th row arrives, the initialization section of (b) happens. In the initialization section, the control signal Gel(i) is changed to an H level, and the control signal Gorst(i) is changed to an L level as compared with the emission section.

Figure 12:
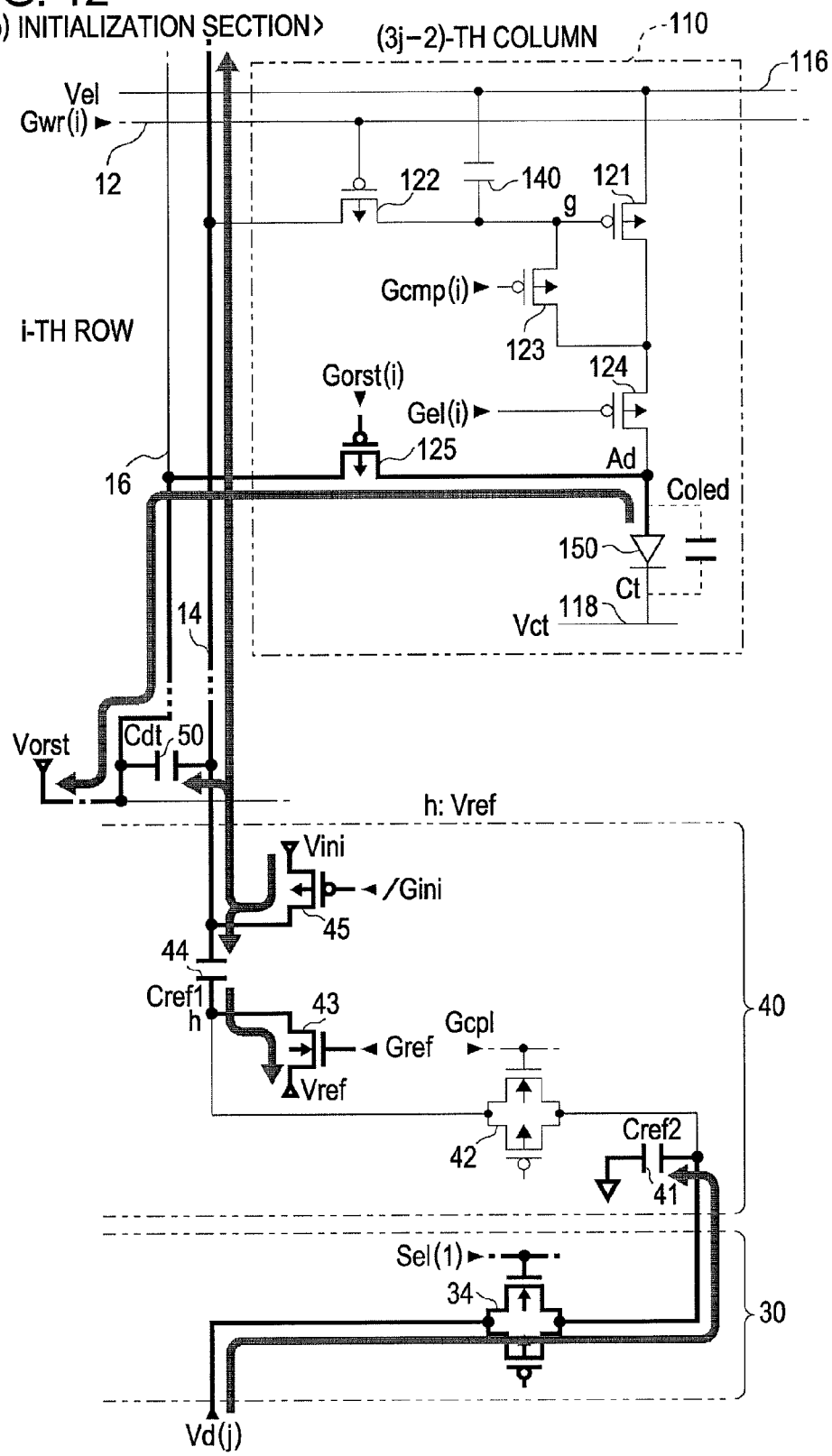
FIG. 12 is a diagram illustrating an operation of the electro-optical device.

Therefore, as shown in FIG. 12, the transistor 124 is turned off, and the transistor 125 is turned on in the pixel circuit 110 of the i-th row and the (3j−2)-th column. Thereby, the path of a current supplied to the OLED 150 is blocked, and the anode Ad of the OLED 150 is reset to a potential Vorst.

The OLED 150 has a configuration in which the organic EL layer is interposed between the anode Ad and the cathode Ct as described above, and thus a parasitic capacitor Coled is formed between the anode Ad and the cathode Ct as indicated by the broken line in the figure. When a current flows through the OLED 150 in the emission section, a both-end voltage between the anode and the cathode of the OLED 150 is stored, but this stored voltage is rest when the transistor 125 is turned on. Therefore, in the present embodiment, when a current flows through the OLED 150 again in the subsequent emission section, it is difficult to be influenced by the voltage stored in the capacitor Coled.

Specifically, for example, when a high luminance display state is changed to a low luminance display state, since a high voltage in the high luminance (a large current has flowed) is maintained in a configuration in which reset is not performed, an excessive current flows even if a small current is intended to flow next, and thus the low luminance display state cannot be realized. In contrast, in the present embodiment, since a potential of the anode Ad of the OLED 150 is reset when the transistor 125 is turned on, it is possible to increase low luminance side reproducibility.

Further, in the present embodiment, the potential Vorst is set such that a difference between the potential Vorst and the potential Vct of the common electrode 118 is lower than an emission threshold voltage of the OLED 150. For this reason, the OLED 150 is turned off (does not emit light) in the initialization section (the compensation section and the writing section described later).

On the other hand, in the initialization section, the control signal /Gini is turned to an L level, the control signal Gref is turned to an H level, and the control signal Gcpl is turned to an L level. For this reason, in the level shift circuit 40, as shown in FIG. 12, the transistors 45 and 43 are turned off, and the transmission gate 42 is turned off. Therefore, the data line 14 which is one end of the storage capacitor 44 is initialized to the potential Vini, and the node h which is the other end of the storage capacitor 44 is initialized to the potential Vref.

Here, the potential Vini is set such that (Vel-Vini) is greater than the threshold voltage |Vth| of the transistor 121. In addition, since the transistor 121 is of a P channel type, the threshold voltage Vth is negative with respect to a potential of the source node. Therefore, in order to prevent confusion due to description of height relationship, the threshold voltage is defined with magnitude relationship by being expressed by an absolute value |Vth|.

In addition, the control circuit 5 supplies a data signal over the initialization section and the compensation section. In other words, when attention is packet identifier to the j-th group, the control circuit 5 sequentially converts a data signal Vd(j) into potentials corresponding to grayscale levels of the pixels of the i-th row and the (3j−2)-th column, the i-th row and the (3j−1)-th column, and the i-th row and the 3j-th column, and sequentially makes the control signals Sel(1), Sel(2) and Sel(3) exclusively turned to an H level in synchronization with the conversion of the potential of the data signal. Thereby, in the demultiplexer 30, the transmission gates 34 in each group are turned on in order of the leftmost column, the central column, and the rightmost column.

Here, in the initialization section, when the leftmost transmission gate 34 belonging to the j-th group is turned on in response to the control signal Sel(1), as shown in FIG. 12, the data signal Vd(j) is supplied to one end of the storage capacitor 41, and thus the data signal is stored by the storage capacitor 41.

Compensation Section

In the scanning period of the i-th row, the compensation section of (c) arrives next. In the compensation section, the scanning signal Gwr(i) and the control signal Gcmp(i) are turned to an L level as compared with the initialization section. On the other hand, in the compensation section, the control signal /Gini is turned to an H level in a state in which the control signal Gref is maintained in an H level.

Figure 13:
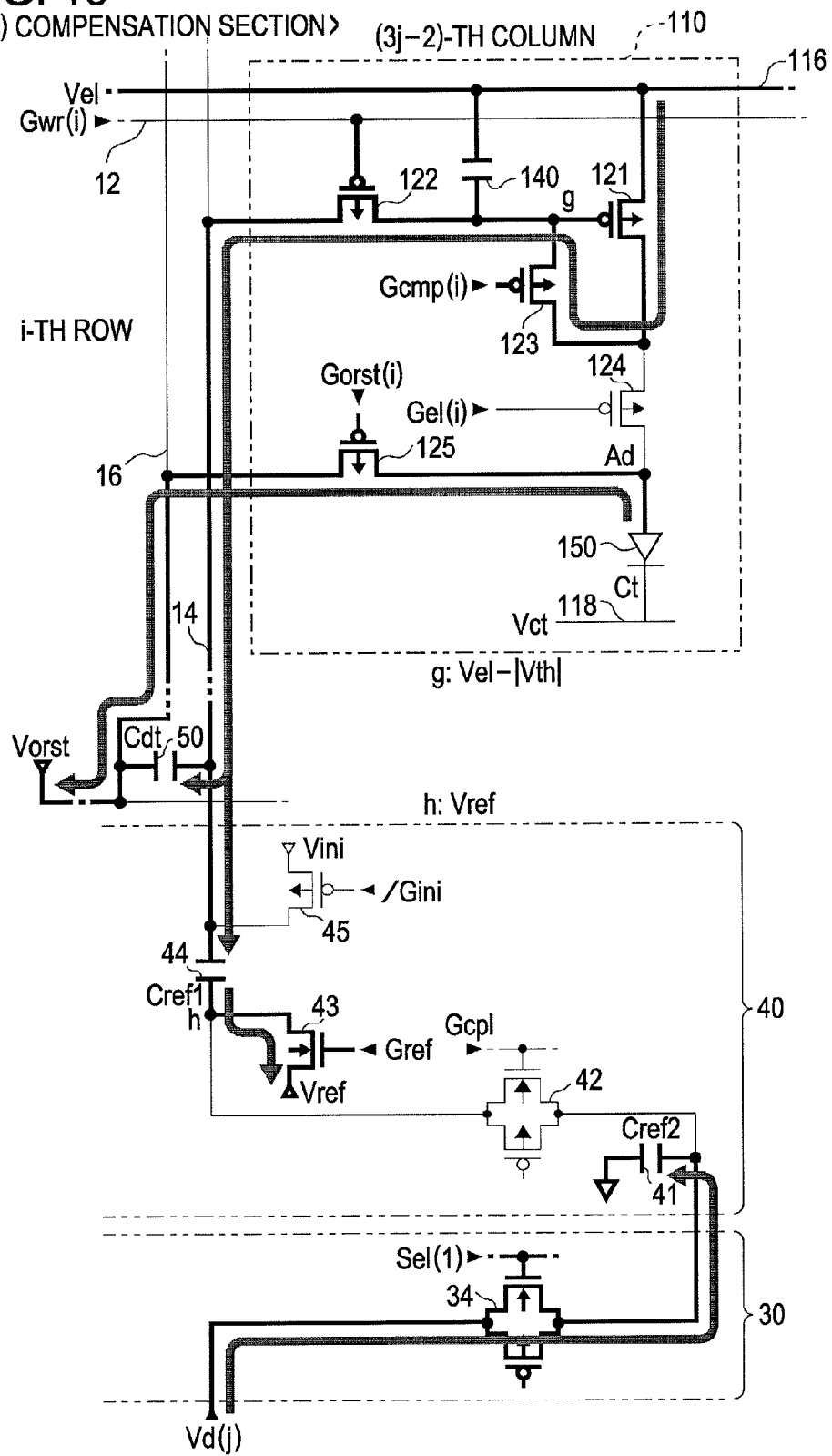
FIG. 13 is a diagram illustrating an operation of the electro-optical device.

For this reason, as shown in FIG. 13, in the pixel circuit 110 of the i-th row and the (3j−2)-th column, the transistor 122 is turned on so as to electrically connect the gate node g to the data line 14, and the transistor 123 is turned on so as to form diode-connection of the transistor 121.

Therefore, a current flows through a path of the voltage supply line 116, the transistor 121, the transistor 123, the transistor 122, and the data line 14 of the (3j−2)-th column, and thus a potential of the gate node g increases from the potential Vini. However, since the current flowing through the path becomes hard to flow as the gate node g is closer to a potential (Vel−|Vth|), the data line 14 and the gate node g are saturated to the potential (Vel−|Vth|) until the end of the compensation section. Therefore, the storage capacitor 140 stores the threshold voltage |Vth| of the transistor 121 until the end of the compensation section.

On the other hand, since the control signal /Gini is in an H level in a state in which the control signal Gref is maintained in an H level in the level shift circuit 40, the node h in the level shift circuit 40 is fixed to the potential Vref.

In a case where the leftmost transmission gate 34 belonging to the j-th group has been already turned on in response to the control signal Sel(1) in the initialization section, the transmission gate 34 is not turned on in the compensation section.

In addition, if the compensation section finishes, the control signal Gcmp(i) is turned to an H level, and thus the diode-connection of the transistor 121 is cancelled.

In addition, the control signal Gref is turned to an L level until the subsequent writing section starts after the compensation section finishes, and thus the transistor 43 is turned off. For this reason, the path from the data line 14 of the (3j−2)-th column to the pixel circuit 110 of the i-th row and the (3j−2)-th column is in a floating state, but a potential of the path is maintained at (Vel−|Vth|) by the storage capacitors 50 and 140.

Writing Section

In the scanning period of the i-th row, the writing section arrives after the compensation section of (c). In the writing section, the control signal Gcmp(i) are turned to an H level, and the control signal /Gini is turned to an H level (the control signal /Gcp1 is turned to an L level) in a state in which the control signal Gref is in an L level in the compensation section.

Figure 14:
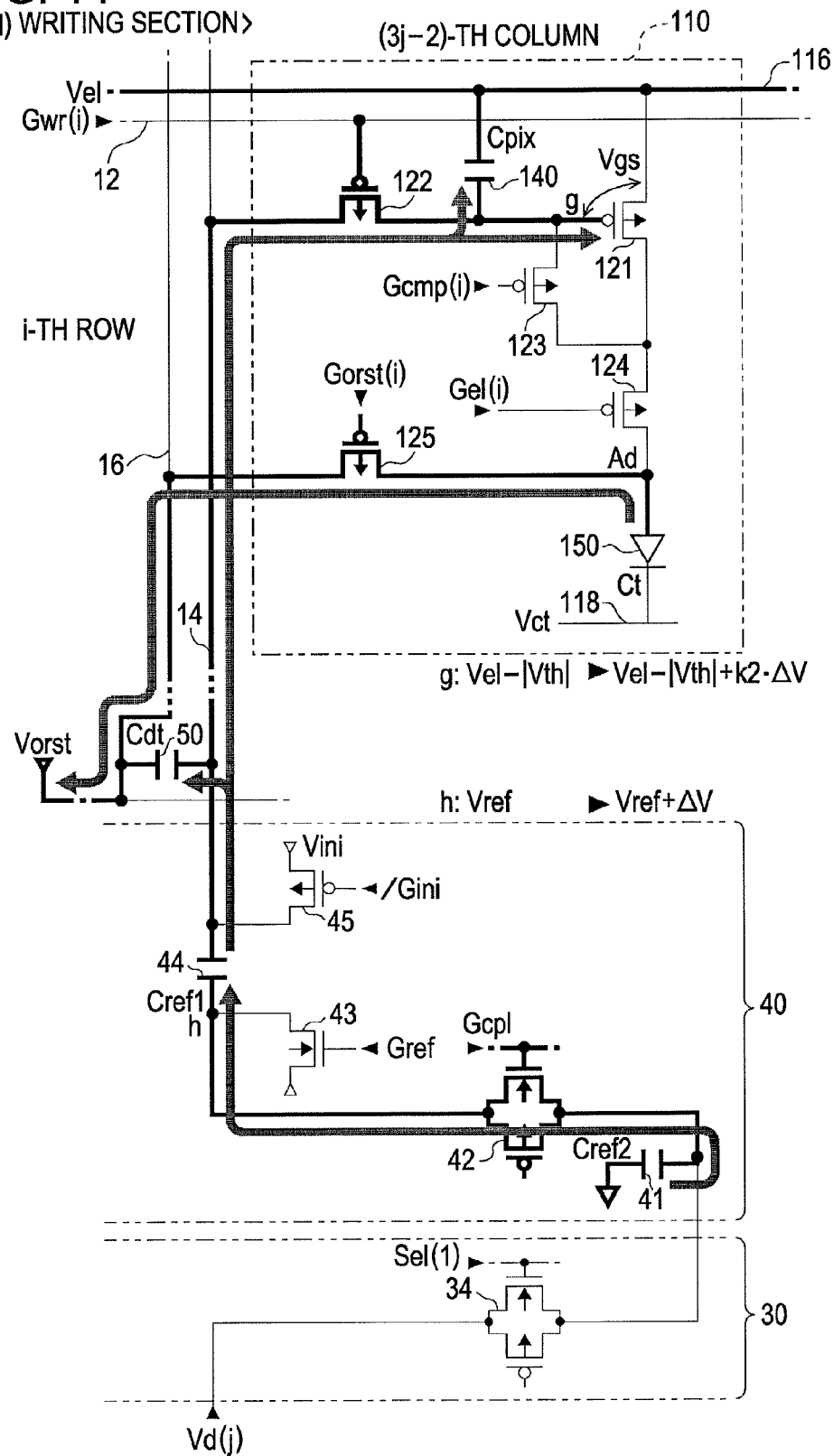
FIG. 14 is a diagram illustrating an operation of the electro-optical device.

For this reason, as shown in FIG. 14, in the level shift circuit 40, the transmission gate 42 is turned on, and thus the data signal stored in the storage capacitor 41 is supplied to the node h which is the other end of the storage capacitor 44. In other words, a signal with a potential corresponding to luminance of the OLED 150 is supplied to the node h. Therefore, the node h is shifted from the potential Vref in the compensation section. A potential variation of the node h at this time is indicated by ΔV, and a potential after the variation is indicated by (Vref+ΔV).

On the other hand, the gate node g is connected to one end of the storage capacitor 44 via the data line 14 and is thus shifted from the potential (Vel−|Vth|) in the compensation section by a value obtained by multiplying the potential variation ΔV of the node h by a capacitance ratio k2. In other words, the potential of the gate node g becomes a value (Vel−|Vth|+k2·ΔV) which is shifted from the potential (Vel−|Vth|) by a value obtained by multiplying the potential variation ΔV of the node h by the capacitance ratio k2. When expressed with an absolute value of the voltage Vgs of the transistor 121, this value becomes a value (|Vth|−k2·ΔV) which is shifted from the threshold value |Vth| by an amount corresponding to a potential shift of the gate node g.

In addition, the capacitance ratio k2 is a capacitance ratio defined by Cdt, Cref1, and Cref2. Strictly, the capacitance Cpix of the storage capacitor 140 is taken into consideration, but the capacitance Cpix is set to be sufficiently smaller than the capacitances Cdt, Cref1 and Cref2, and is thus disregarded.

Figure 15:
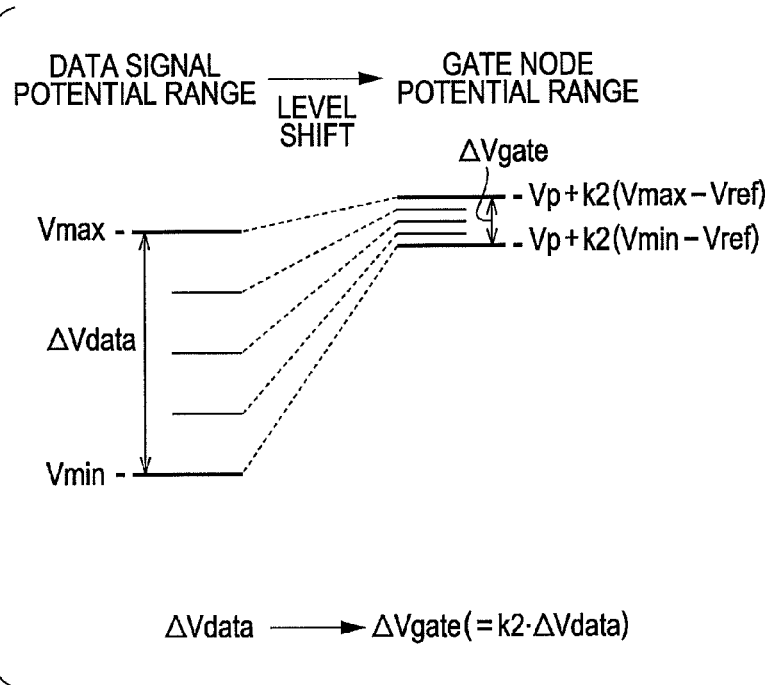
FIG. 15 is a diagram illustrating an amplitude compression of a data signal in the electro-optical device.

FIG. 15 is a diagram illustrating a relationship between a potential of the data signal and a potential of the gate node g in the writing section. The data signal supplied from the control circuit 5 can have a potential range from the minimum value Vmin to the maximum value Vmax according to a grayscale level of a pixel as described above. In the present embodiment, the data signal is not directly written in the gate node g but is level-shifted and is then written in the gate node g as shown in the figure.

At this time, a potential range ΔVgate of the gate node g is compressed into a value obtained by a potential range ΔVdata (=Vmax−Vmin) of the data signal by the capacitance ratio k2.

In addition, in which direction the potential range ΔVgate of the gate node g is shifted with respect to the potential range ΔVdata of the data signal may be determined using potentials Vp (=Vel−|Vth|) and Vref. This is because the potential range ΔVdata of the data signal is compressed with the capacitance ratio k2 using the potential Vref as a reference, and, if the compression range is shifted with respect to the potential Vp, this leads to the potential range ΔVgate of the gate node g.

As above, in the writing section of the i-th row, a potential (Vel−|Vth|+k2·ΔV) which is shifted from the potential (Vel−|Vth|) in the compensation section by a value obtained by multiplying the potential variation ΔV of the node h by the capacitance ratio k2, is written in the gate node g of the pixel circuit 110 of the i-th row.

Finally, the scanning signal Gwr(i) is turned to an H level, and thus the transistor 122 is turned off. Thereby, the writing section finishes, and the potential of the gate node g is fixed to the shifted value.

Emission Section

In the present embodiment, the writing section of the i-th row finishes, and, then, the emission section arrives after one horizontal scanning period (H) has elapsed. In the emission section, as described above, the control signal Gel(i) is turned to an L level, and thus the transistor 124 is turned on in the pixel circuit 110 of the i-th row and the (3j–2)-th column. The voltage Vgs between the gate and the source is (|Vth|–k2·ΔV), and thereby a current corresponding to a grayscale level is supplied to the OLED 150 in a state of compensating the threshold voltage of the transistor 121 as shown in FIG. 11.

This operation is performed temporally in parallel in the pixel circuits 110 of the i-th row other than the pixel circuit 110 of the (3j–2)-th column in the scanning period of the i-th row. In addition, the operation in the i-th row is performed in order of the first, the second, the third, . . . , the (m–1)-th and the m-th rows during one frame period and is repeatedly performed for each frame.

According to the present embodiment, since the potential range ΔVgate of the gate node g can be narrowed with respect to the potential range ΔVdata of the data signal, a voltage reflecting a grayscale level can be applied between the gate and the source of the transistor 121 even if the data signal is not finely divided. For this reason, even in a case where micro-current flowing through the OLED 150 relatively greatly varies with respect to a variation in the voltage Vgs between the gate and the source of the transistor 121 in the fine pixel circuit 110, a current supplied to the OLED 150 can be controlled with high accuracy.

In the level shift circuit 40, when a data signal is supplied to the data line 14 via the storage capacitor 44, the data signal is level-shifted such that the potential amplitude is compressed. During the level shift, if a potential of one end (the data line 14) or the other end (the node h) of the storage capacitor 44 is influenced by a potential variation of another element via a coupling capacitor, a potential obtained by accurately level-shifting a potential of the data signal cannot be supplied to the data line 14, and, as a result, there is concern in which display quality may deteriorate.

In contrast, in the present embodiment, particularly, as shown in FIG. 6, the voltage supply lines 16 for supplying the potential Vorst are respectively provided on both the left and right sides of the storage capacitor 44 as a constant potential line in plan view. For this reason, both ends of the storage capacitor 44 are shielded from potential variations of the adjacent columns, and thus deterioration in display quality can be suppressed.

In addition, the voltage supply lines 16 parts which shield both ends of the storage capacitor 44 have a structure in which the wire 16a formed of the same conductive layer as the electrode 44a which is one end of the storage capacitor 44 and the wire 16g formed of the same conductive layer as the electrode 44g which is the other end of the storage capacitor 44 are laminated, particularly, as shown in FIG. 8. Therefore, capacitance coupling in a tilt direction is reduced in cross-sectional view as compared with a case where the voltage supply line 16 is formed using a single layer different from the conductive layer which constitutes the storage capacitor 44, and thus the shield function can be further improved.

In addition, in the present embodiment, the wires 16g and 16a are connected to the voltage supply line 16 via the contact holes 16e and 16f. These contact holes 16a and 16f are some kind of barrier walls of electric charge in the first interlayer insulating film L1 and the second interlayer insulating film L2, and thus the shield function can be further improved.

In the present embodiment, as shown in FIG. 6, in addition to both the left and right sides of the storage capacitor 44, the laminate of the voltage supply line 61 and the wire 61g is provided on the upper side of the storage capacitor 44, and the laminate of the voltage supply line 62 and the wire 62g is provided on the lower side thereof.

The voltage supply line 61 is formed of the same conductive layer as the electrode 44a, the wire 61g is formed of the same conductive layer as the electrode 44g, and the voltage supply line 61 is connected to the wire 61g via the contact hole 61e. Since the control signal /Gini is supplied to the control signal 63, a potential thereof varies between an L level and an H level of the logic signal, but, the storage capacitor 44 is shielded by the laminate of the voltage supply line 61 and the wire 61g and is thus hard to be influenced by a potential variation of the control line 63.

On the other hand, the voltage supply line 62 is formed of the same conductive layer as the electrode 44a, the wire 62g is formed of the same conductive layer as the electrode 44g, and the voltage supply line 62 is connected to the wire 62g via the contact hole 62e. Since the control signal Gref is supplied to the control signal 64, a potential thereof varies between an L level and an H level of the logic signal, but, the storage capacitor 44 is shielded by the laminate of the voltage supply line 62 and the wire 62g and is thus hard to be influenced by a potential variation of the control line 64.

As above, in the present embodiment, the four sides of the storage capacitor 44 are surrounded by the voltage supply lines 16, 61 and 62 in plan view, and thus a both-end potential of the storage capacitor 44 is effectively shielded from peripheral potential variations. For this reason, it is possible to suppress deterioration in display quality.

Further, since the storage capacitor 44 has a rectangular shape which is long the in the longitudinal direction in plan view, the shield by the voltage supply line 16 is more important than by the voltage supply lines 61 and 62.

In addition, although, in the present embodiment, the voltage supply lines 16 for supplying the potential Vorst are used as constant potential lines provided on the left and right sides of the storage capacitor 44, the invention is not limited to the voltage supply line 16 from the viewpoint of a constant potential being preferably supplied to the pixel circuit 110. For example, the voltage supply line 16 may extend in the row direction, and the voltage supply lines 116 for supplying the potential Vel which is a high potential side of the power supply may be provided on the left and right sides of the storage capacitor 44. In addition, voltage supply lines connected to the common electrode 118 of the potential Vct which is a low potential side of the power supply may be provided on the left and right sides of the storage capacitor 44.

Although, in the present embodiment, for example, the wire 16a is connected to the wire 16g via a plurality of contact holes 16e, and the voltage supply line 16 is connected to the wire 16a via a plurality of contact holes 16f, the number of contact holes is defined depending on a predetermined design rule. For this reason, the number of contact holes may be one in plan view depending on a design rule, and an opening portion thereof may have a rectangular shape which is long in the longitudinal direction.

Figure 17:
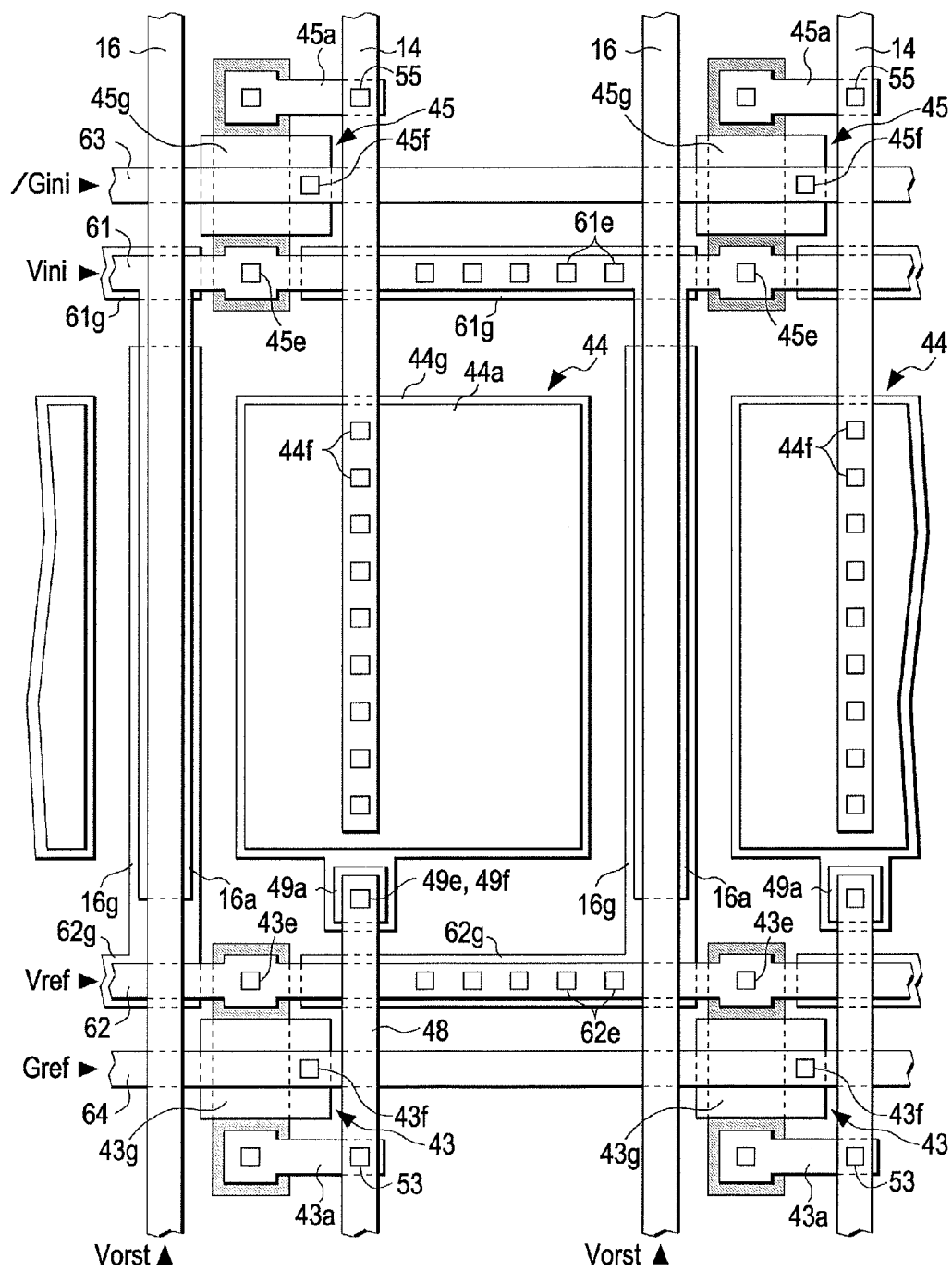
FIG. 17 is a plan view illustrating a configuration of main parts of a level shift circuit according to an application example.

Although the wires 16g and 16a are connected to the voltage supply line 16 via the contact holes 16e and 16f and are supplied with the common potential Vorst, the wires 16g and 16a may be supplied with different potentials without being connected to each other. For example, as shown in FIG. 17, the wire 16g may be a wire branched from the wire 61g and be supplied with the initial potential Vref of the electrode 44g via the contact hole 62e, and the wire 16a may be a wire branched from the voltage supply line 61 and be supplied with the initial potential Vini of the electrode 44a.

Meanwhile, according to the present embodiment, influence of a threshold voltage is cancelled out in the current Ids which is supplied to the OLED 150 by the transistor 121. For this reason, according to the present embodiment, even if the threshold voltage of the transistor 121 varies for each pixel circuit 110, the variation is compensated and thus a current corresponding to a grayscale level is supplied to the OLED 150. Therefore, unevenness of the display which seems to spoil uniformity of a display screen can be suppressed from occurring, and thereby high quality display can be performed.

Figure 16:
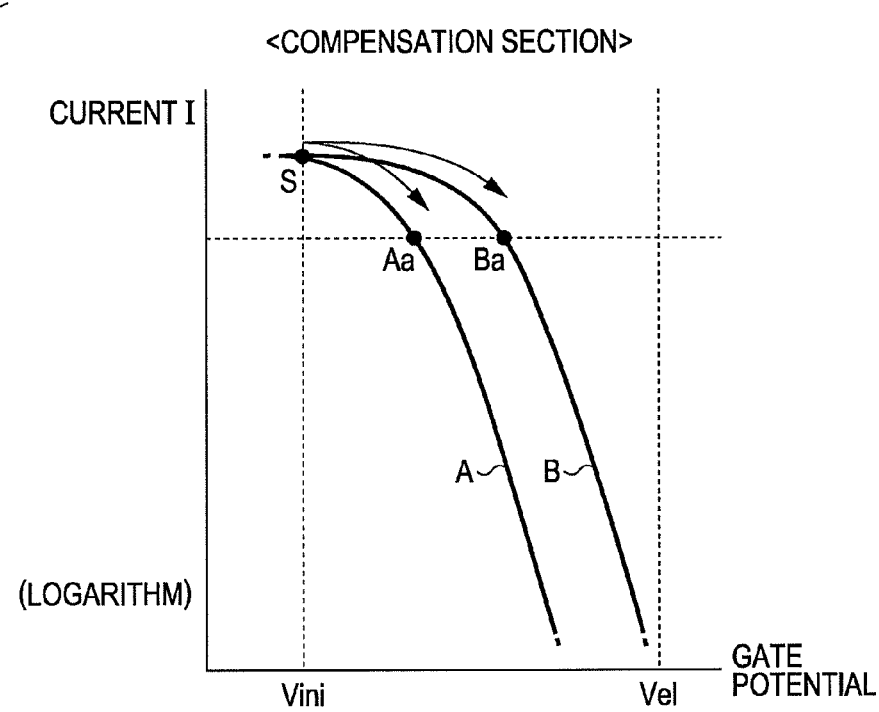
FIG. 16 is a diagram illustrating characteristics of a transistor in the electro-optical device.
Figure 16:
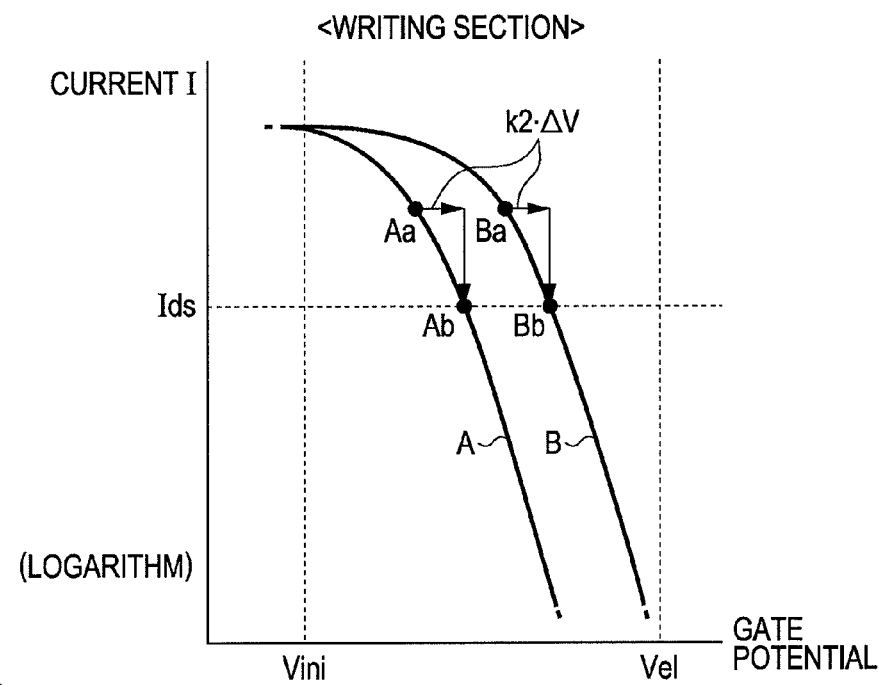

This cancellation will be described with reference to FIG. 16. As shown in this figure, the transistor 121 is operated in a weak inversion region (a sub-threshold region) so as to control micro-current supplied to the OLED 150.

In the figure, the reference numeral A indicates a transistor of which the threshold voltage |Vth| is large, and the reference numeral B indicates a transistor of which the threshold voltage |Vth| is small. In addition, in FIG. 16, the gate-source voltage Vgs corresponds to a difference between the characteristic indicated by the solid line and the potential Vel. Further, in FIG. 16, a current on the longitudinal scale is expressed by logarithm in which a direction from a source to a drain is positive (upward).

In the compensation section, a potential of the gate node g becomes (Vel−|Vth|) from the potential Vini. For this reason, an operation point S of the transistor A of which the threshold voltage |Vth| is large is moved to a point Aa, and an operation point S of the transistor B of which the threshold voltage |Vth| is small is moved to a point Ba.

Next, in a case where potentials of the data signals applied to the pixel circuit 110 to which the two transistors belong are the same, that is, the same grayscale level is designated, both of potential shift amounts from the operation points Aa and Ba are k2·ΔV and are the same. For this reason, the operation point of the transistor A is moved from Aa to Ab, and the operation point of the transistor B is moved from Ba to Bb, but a current at the operation point after the potential shift matches the approximately same Ids in both of the transistors A and B.

Thereby, according to the present embodiment, even if the threshold voltage of the transistor 121 varies for each pixel circuit 110, the variation is compensated.

In addition, according to the present embodiment, a data signal supplied from the control circuit 5 is temporarily stored in the storage capacitor 41 from the initialization section to the compensation section, and the stored potential is level-shifted and is then supplied to the data line 14 in the writing section. For this reason, when seen from the control circuit 5, a data signal is preferably supplied not in the writing period but over a relatively long period from the initialization section to the compensation section, and thus it is possible to reduce the speed of the supply operation of a data signal.

APPLICATION AND MODIFICATION EXAMPLES

The invention is not limited to the above-described embodiment or application example, and may have, for example, various modifications as described below. In addition, modification aspects described below may be used singly or through an appropriate combination of a plurality of randomly selected aspects.

Electrode of Storage Capacitor

Although, in the embodiment, the electrode 44g of the storage capacitor 44 is formed of the first conductive layer, and the electrode 44a is formed of the second conductive layer, for example, the electrode 44g may be formed of the second conductive layer, and the electrode 44a may be formed of the third conductive layer. Although, in the embodiment, the electrode 44g is a lower electrode of the electrode 44a in cross-sectional view, the electrode 44g may be an upper electrode of the electrode 44a.

Control Circuit

Although, in the embodiment, the control circuit 5 which supplies a data signal is separated from the electro-optical device 10, the control circuit 5 may be integrated on the semiconductor silicon substrate along with the scanning line driving circuit 20, the demultiplexer 30, and the level shift circuit 40.

Substrate

Although, in the embodiment, the electro-optical device 10 is integrated on the semiconductor silicon substrate, the electro-optical device 10 may be integrated on other semiconductor substrates. For example, an SOI substrate may be used. In addition, the electro-optical device 10 may be formed on a glass substrate or the like by employing a poly-silicon process.

Control Signal Gcmp(i)

Although, in the embodiment, the control signal Gcmp(i) is in an H level in the writing section in the i-th row, the control signal Gcmp(i) may be in an L level. That is to say, threshold compensation and writing in the gate node g may be performed in parallel when the transistor 123 is turned on.

Demultiplexer

Although, in the embodiment, the data lines 14 are grouped every three columns, and the data lines 14 are sequentially selected in each group and are supplied with data signals, the number of data lines forming a group may be "2" or "4" or more.

In addition, data signals may be simultaneously supplied to the data lines 14 of the respective columns in a line sequential manner without grouping, that is, without using the demultiplexer 30.

Channel Type of Transistor

Although, in the above-described embodiment and the like, the transistors 121 to 125 of the pixel circuit 110 are unified to a P channel type, the transistors may be unified to an N cannel type. In addition, a P channel type and an N cannel type may be appropriately combined.

Others

Although, in the embodiment and the like, an OLED which is a light emitting element is exemplified as an electro-optical element, an electro-optical element which emits light at a luminance corresponding to a current, such as, for example, an inorganic light emitting diode or a Light Emitting Diode (LED).

Electronic Apparatus

Next, a description will be made of an electronic apparatus to which the electro-optical device 10 according to the embodiment and the like or the application examples is applied. The electro-optical device 10 is suitable for use in a small-sized pixel and high definition display. Therefore, a head mounted display will be described as an example of the electronic apparatus.

Figure 18:
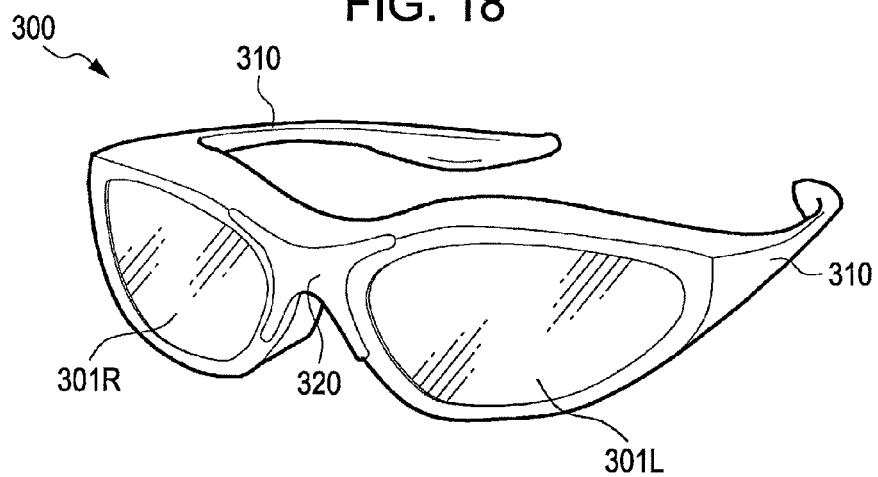
Figure 19:
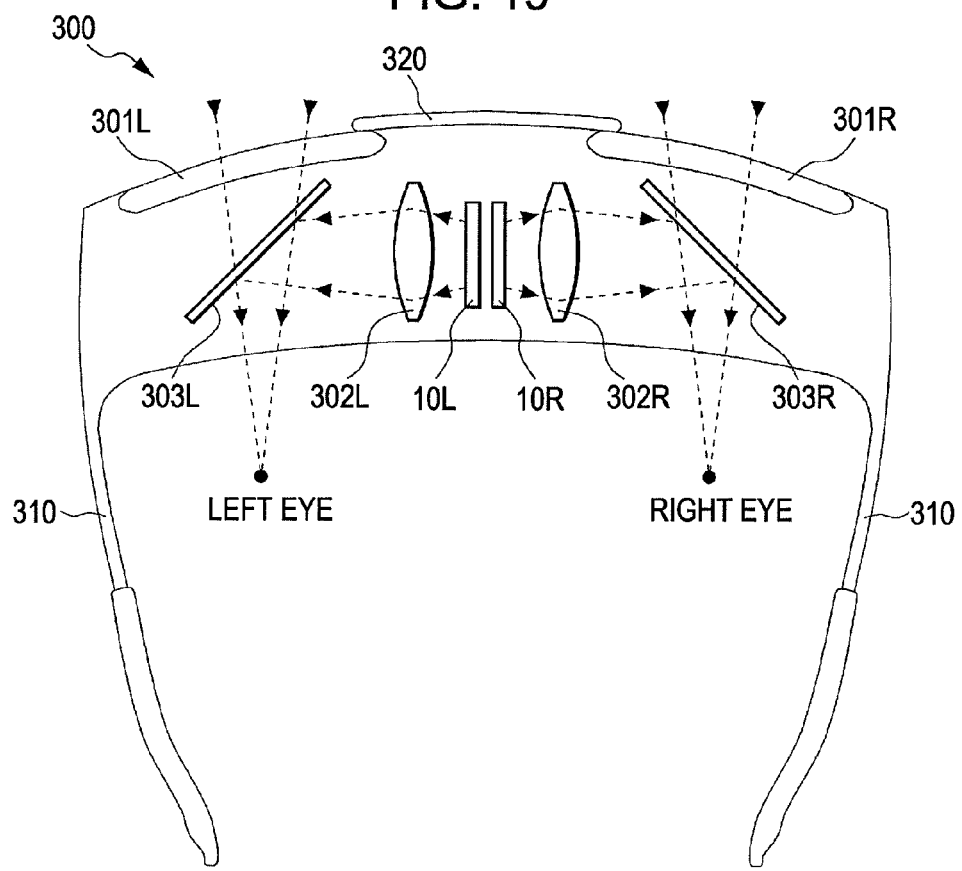
FIG. 19 is a diagram illustrating an optical configuration of the HMD.

FIG. 18 is a diagram illustrating an exterior of the head mounted display, and FIG. 19 is a diagram illustrating an optical configuration thereof.

First, as shown in FIG. 18, the head mounted display 300 has temples 310, a bridge 320, and lenses 301L and 301R in the same manner as general glasses in appearance. In addition, as shown in FIG. 19, the head mounted display 300 is provided with an electro-optical device 10L for the left eye and an electro-optical device 10R for the right eye around the bridge 320 inside the lenses 301L and 301R (the lower side in the figure).

An image display surface of the electro-optical device 10L is disposed so as to be located on the left side in FIG. 19. Thereby, a display image by the electro-optical device 10L is emitted in a nine o'clock direction in the figure via an optical lens 302L. A half mirror 303L reflects the display image by the electro-optical device 10L in a six o'clock direction and transmits light incident from a twelve o'clock direction therethrough.

An image display surface of the electro-optical device 10R is disposed so as to be located on the right side opposite to the electro-optical device 10L. Thereby, a display image by the electro-optical device 10R is emitted in a three o'clock direction in the figure via an optical lens 302R. A half mirror 303R reflects the display image by the electro-optical device 10R in the six o'clock direction and transmits light incident from the twelve o'clock direction therethrough.

In this configuration, a wearer of the head mounted display 300 can observe the display images by the electro-optical devices 10L and 10R in a see-through manner in a state of overlapping the surroundings.

Further, when a left eye image of binocular images with a parallax is displayed on the electro-optical device 10L, and a right eye image thereof is displayed on the electro-optical device 10R in the head mounted display 300, the wearer can perceive the display images as if the images have a depth or a stereoscopic effect (3D display).

In addition, the electro-optical device 10 is applicable to an electronic view finder provided in a video camera or an interchangeable lens type digital camera, in addition to the head mounted display 300.

The entire disclosure of Japanese Patent Application No. 2012-099990, filed Apr. 25, 2012 is expressly incorporated by reference herein.

What is claimed is:

1. An electro-optical device comprising:
   a plurality of data lines;
   a first pixel circuit provided so as to correspond to a first data line among the plurality of data lines;
   a second pixel circuit provided so as to correspond to a second data line among the plurality of data lines, each of the first pixel circuit and the second pixel circuit including a light emitting element and a driving transistor that supplies a current corresponding to a gate-source voltage to the light emitting element;
   a first storage capacitor of which one end is connected to the first data line and the other end is configured that a potential of the other end is able to be shifted according to a current to be supplied to the light emitting element of the first pixel circuit, wherein the first storage capacitor is located separate from the first pixel circuit;
   a second storage capacitor of which one end is connected to the second data line and the other end is configured that a potential of the other end is able to be shifted according to a current to be supplied to the light emitting element of the second pixel circuit; and
   a constant potential line provided between the first storage capacitor and the second storage capacitor in plan view,
   wherein one end of the first storage capacitor and one end of the second storage capacitor are formed of one of a first conductive layer and a second conductive layer,
   wherein the other end of the first storage capacitor and the other end of the second storage capacitor are formed of the other of the first conductive layer and the second conductive layer, and
   wherein the constant potential line is formed of at least a wire of the first conductive layer and a wire of the second conductive layer.

2. The electro-optical device according to claim 1, wherein the wire of the first conductive layer and the wire of the second conductive layer of the constant potential line are electrically connected to each other.

3. The electro-optical device according to claim 1, wherein the light emitting element is a two-terminal element,
   wherein the light emitting element and the driving transistor are electrically connected in series between two different power supply potentials,
   wherein, of the two terminals of the light emitting element, a potential of the terminal on the driving transistor side becomes a predetermined reset potential after a current is supplied by the driving transistor, and
   wherein the reset potential is supplied to the constant potential line.

4. The electro-optical device according to claim 1, wherein the light emitting element and the driving transistor are electrically connected in series between two different power supply potentials, and
   wherein one of the two different power supply potentials is supplied to the constant potential line.

5. An electronic apparatus comprising the electro-optical device according to claim 1.

6. An electronic apparatus comprising the electro-optical device according to claim 2.

7. An electronic apparatus comprising the electro-optical device according to claim 3.

8. An electronic apparatus comprising the electro-optical device according to claim 4.

9. An electro-optical device comprising:
   a plurality of data lines;
   a first pixel circuit provided so as to correspond to a first data line among the plurality of data lines;
   a second pixel circuit provided so as to correspond to a second data line among the plurality of data lines, each of the first pixel circuit and the second pixel circuit including a light emitting element and a driving transistor that supplies a current corresponding to a gate-source voltage to the light emitting element;
   a first storage capacitor of which one end is connected to the first data line and the other end is configured that a potential of the other end is able to be shifted according to a current to be supplied to the light emitting element of the first pixel circuit;
   a second storage capacitor of which one end is connected to the second data line and the other end is configured that a potential of the other end is able to be shifted according to a current to be supplied to the light emitting element of the second pixel circuit; and
   a constant potential line provided between the first storage capacitor and the second storage capacitor in plan view,
   wherein one end of the first storage capacitor and one end of the second storage capacitor are formed of one of a first conductive layer and a second conductive layer,
   wherein the other end of the first storage capacitor and the other end of the second storage capacitor are formed of the other of the first conductive layer and the second conductive layer, and
   wherein the constant potential line is formed of at least a wire of the first conductive layer and a wire of the second conductive layer.

10. The electro-optical device according to claim 9, wherein the wire of the first conductive layer and the wire of the second conductive layer of the constant potential line are electrically connected to each other.

11. The electro-optical device according to claim 9, wherein the light emitting element is a two-terminal element,
   wherein the light emitting element and the driving transistor are electrically connected in series between two different power supply potentials,
   wherein, of the two terminals of the light emitting element, a potential of the terminal on the driving transistor side becomes a predetermined reset potential after a current is supplied by the driving transistor, and
   wherein the reset potential is supplied to the constant potential line.

12. The electro-optical device according to claim 9, wherein the light emitting element and the driving transistor are electrically connected in series between two different power supply potentials, and
   wherein one of the two different power supply potentials is supplied to the constant potential line.

13. An electronic apparatus comprising the electro-optical device according to claim 9.

* * * * *